US011539230B2

(12) United States Patent
Tian et al.

(10) Patent No.: US 11,539,230 B2
(45) Date of Patent: Dec. 27, 2022

(54) DEVICE CHARGING SYSTEM, CHARGING METHOD, AND POWER ADAPTER

(71) Applicant: GUANGDONG OPPO MOBILE TELECOMMUNICATIONS CORP., LTD., Dongguan (CN)

(72) Inventors: Chen Tian, Dongguan (CN); Jialiang Zhang, Dongguan (CN)

(73) Assignee: GUANGDONG OPPO MOBILE TELECOMMUNICATIONS CORP., LTD., Dongguan (CN)

( * ) Notice: Subject to any disclaimer, the term of this patent is extended or adjusted under 35 U.S.C. 154(b) by 145 days.

(21) Appl. No.: 15/807,511

(22) Filed: Nov. 8, 2017

(65) Prior Publication Data

US 2018/0069418 A1    Mar. 8, 2018

Related U.S. Application Data

(63) Continuation of application No. PCT/CN2017/070537, filed on Jan. 7, 2017.

(30) Foreign Application Priority Data

Feb. 5, 2016  (WO) ................ PCT/CN2016/073679
Jul. 26, 2016  (CN) .......................... 201610600612.3

(51) Int. Cl.
*H02J 7/02* (2016.01)
*G01R 31/3842* (2019.01)
*H02M 3/335* (2006.01)
*H02J 7/00* (2006.01)
*H02M 7/217* (2006.01)
*H02J 7/06* (2006.01)
*H02M 1/08* (2006.01)
(Continued)

(52) U.S. Cl.
CPC ............ *H02J 7/02* (2013.01); *G01R 31/3842* (2019.01); *H01M 10/0525* (2013.01);
(Continued)

(58) Field of Classification Search
None
See application file for complete search history.

(56) References Cited

U.S. PATENT DOCUMENTS 4,087,733 A    5/1978  Casagrande
5,684,386 A   11/1997  Okada
(Continued)

FOREIGN PATENT DOCUMENTS

CN    1228637    9/1999
CN    1897394    1/2007
(Continued)

OTHER PUBLICATIONS

WIPO, ISR for Application No. PCT/CN2017/070537, dated Mar. 1, 2017.
(Continued)

*Primary Examiner* — Drew A Dunn
*Assistant Examiner* — Tynese V McDaniel
(74) *Attorney, Agent, or Firm* — Hodgson Russ LLP

(57) ABSTRACT

The present disclosure provides a charging system and method and a power adapter. The system includes: a battery; a first rectification unit, configured to output a voltage with a first pulsating waveform; a switch unit, configured to modulate the voltage with the first pulsating waveform; a transformer, configured to output a voltage with a second pulsating waveform according to the modulated voltage; a second rectification unit, configured to rectify the voltage with the second pulsating waveform to output a voltage with a third pulsating waveform; and a control unit, configured to output the control signal to the switch unit to decrease a length of a valley of the voltage with the third pulsating waveform such that a peak value of a voltage of the battery is sampled.

15 Claims, 11 Drawing Sheets

(51) Int. Cl.

| | | |
|---|---|---|
| *H02J 7/04* | (2006.01) | |
| *H02M 7/06* | (2006.01) | |
| *H01M 10/0525* | (2010.01) | |
| *H01M 10/42* | (2006.01) | |
| *H01M 10/44* | (2006.01) | |
| *H02M 1/44* | (2007.01) | |
| *H02M 5/04* | (2006.01) | |
| *H02M 7/04* | (2006.01) | |
| *H02J 7/24* | (2006.01) | |
| *H02M 1/00* | (2006.01) | |

(52) U.S. Cl.
CPC ......... *H01M 10/425* (2013.01); *H01M 10/44* (2013.01); *H02J 7/0031* (2013.01); *H02J 7/0071* (2020.01); *H02J 7/00711* (2020.01); *H02J 7/00712* (2020.01); *H02J 7/00714* (2020.01); *H02J 7/007182* (2020.01); *H02J 7/007188* (2020.01); *H02J 7/007192* (2020.01); *H02J 7/04* (2013.01); *H02J 7/06* (2013.01); *H02M 1/08* (2013.01); *H02M 1/44* (2013.01); *H02M 3/335* (2013.01); *H02M 3/33507* (2013.01); *H02M 3/33523* (2013.01); *H02M 3/33576* (2013.01); *H02M 3/33592* (2013.01); *H02M 5/04* (2013.01); *H02M 7/04* (2013.01); *H02M 7/06* (2013.01); *H02M 7/217* (2013.01); *H01M 10/4257* (2013.01); *H01M 2010/4271* (2013.01); *H02J 7/00* (2013.01); *H02J 7/0025* (2020.01); *H02J 7/00034* (2020.01); *H02J 7/00036* (2020.01); *H02J 7/0042* (2013.01); *H02J 7/00043* (2020.01); *H02J 7/0049* (2020.01); *H02J 7/00304* (2020.01); *H02J 7/2434* (2020.01); *H02J 2207/10* (2020.01); *H02J 2207/20* (2020.01); *H02M 1/0009* (2021.05)

(56) References Cited

U.S. PATENT DOCUMENTS

| | | | |
|---|---|---|---|
| 5,821,736 A | 10/1998 | Yeon | |
| 5,905,364 A | 5/1999 | Ookita | |
| 5,945,811 A * | 8/1999 | Hasegawa | H02J 7/00 320/141 |
| 6,025,695 A | 2/2000 | Friel et al. | |
| 6,100,664 A | 8/2000 | Oglesbee et al. | |
| 6,137,265 A | 10/2000 | Cummings et al. | |
| 6,229,287 B1 | 5/2001 | Ferris et al. | |
| 6,909,617 B1 | 6/2005 | Mirskiy | |
| 9,325,201 B1 | 4/2016 | Aronov et al. | |
| 2003/0102845 A1* | 6/2003 | Aker | H02J 7/022 320/139 |
| 2004/0090209 A1 | 5/2004 | Nishida et al. | |
| 2005/0099157 A1 | 5/2005 | Hercog et al. | |
| 2006/0284595 A1 | 12/2006 | Hsieh et al. | |
| 2007/0076443 A1* | 4/2007 | Yasumura | H02M 1/34 363/16 |
| 2007/0188136 A1 | 8/2007 | Oh | |
| 2007/0222416 A1 | 9/2007 | Sato | |
| 2009/0184685 A1 | 7/2009 | Sim et al. | |
| 2010/0085020 A1* | 4/2010 | Suzuki | B25F 5/00 320/157 |
| 2011/0101910 A1 | 5/2011 | Li et al. | |
| 2013/0009593 A1 | 1/2013 | Takahashi et al. | |
| 2013/0141034 A1 | 6/2013 | Huang et al. | |
| 2014/0028250 A1 | 1/2014 | Nishino | |
| 2014/0136863 A1* | 5/2014 | Fritchman | G06F 1/26 713/310 |
| 2014/0300321 A1* | 10/2014 | Kim | H02J 7/0004 320/111 |
| 2014/0306660 A1* | 10/2014 | Suzuki | H02J 7/0045 320/110 |
| 2014/0362609 A1 | 12/2014 | Bisschop et al. | |
| 2015/0054434 A1 | 2/2015 | Bruyere | |
| 2015/0180244 A1* | 6/2015 | Jung | H02J 7/00036 320/107 |
| 2015/0180356 A1* | 6/2015 | Norisada | H02M 3/33546 363/17 |
| 2015/0244187 A1* | 8/2015 | Horie | H02J 7/0073 320/112 |
| 2015/0260801 A1 | 9/2015 | Trent et al. | |
| 2015/0263638 A1* | 9/2015 | Yang | H02M 7/04 363/125 |
| 2016/0046196 A1 | 2/2016 | Baek | |
| 2016/0072376 A1 | 3/2016 | Ahlers et al. | |
| 2017/0187200 A1 | 6/2017 | Somerville et al. | |
| 2017/0187215 A1* | 6/2017 | Noda | B60L 58/10 |
| 2017/0250557 A1 | 8/2017 | Zhang et al. | |

FOREIGN PATENT DOCUMENTS

| | | |
|---|---|---|
| CN | 101051701 | 10/2007 |
| CN | 101558229 | 10/2009 |
| CN | 202026118 | 11/2011 |
| CN | 102545360 | 7/2012 |
| CN | 102957193 | 3/2013 |
| CN | 103001272 | 3/2013 |
| CN | 203104000 | 7/2013 |
| CN | 102364856 | 10/2013 |
| CN | 103762702 | 4/2014 |
| CN | 103795040 | 5/2014 |
| CN | 203747451 | 7/2014 |
| CN | 203747452 | 7/2014 |
| CN | 104506055 | 4/2015 |
| CN | 104810877 | 7/2015 |
| CN | 104810879 | 7/2015 |
| CN | 104917271 | 9/2015 |
| CN | 104967199 | 10/2015 |
| CN | 104967201 | 10/2015 |
| CN | 204858705 | 12/2015 |
| CN | 106026327 | 10/2016 |
| CN | 106100083 | 11/2016 |
| EP | 2228884 | 9/2010 |
| EP | 2804287 | 11/2014 |
| EP | 2887492 | 6/2015 |
| EP | 2930589 | 10/2015 |
| EP | 2980958 | 2/2016 |
| JP | S6289431 | 4/1987 |
| JP | H01170330 | 7/1989 |
| JP | H04138506 | 5/1992 |
| JP | H09233725 | 9/1997 |
| JP | 2005530468 | 10/2005 |
| JP | 2008136278 | 6/2008 |
| JP | 2012075313 | 4/2012 |
| JP | 2012090480 | 5/2012 |
| JP | 2012223077 | 11/2012 |
| JP | 2012249409 | 12/2012 |
| JP | 2013198262 | 9/2013 |
| JP | 5454781 | 3/2014 |
| JP | 2014220876 | 11/2014 |
| JP | 2015095936 | 5/2015 |
| JP | 2015113349 | 6/2015 |
| JP | 5822304 | 11/2015 |
| JP | 2016063622 | 4/2016 |
| TW | 200616305 | 5/2006 |
| TW | M481439 | 7/2014 |
| WO | 2008086909 | 7/2008 |
| WO | 2008125790 | 10/2008 |
| WO | 2012167677 | 12/2012 |
| WO | 2015113341 | 8/2015 |
| WO | 2015113349 | 8/2015 |
| WO | 2016043099 | 3/2016 |

OTHER PUBLICATIONS

EPO, Office Action for EP Application No. 17746712, dated Mar. 27, 2019.

JPO, Office Action for JP Application No. 2017564896, dated May 28, 2019.

(56) References Cited

OTHER PUBLICATIONS

EPO, Office Action for EP Application No. 17746712, dated Feb. 9, 2018.
JPO, Office Action for JP Application No. 2017564896, dated Jun. 27, 2018.
EPO, Office Action for EP Application No. 17746712, dated Dec. 3, 2018.
JPO, Office Action for JP Application No. 2017564896, dated Nov. 27, 2018.
IPO, Office Action for IN Application No. 201737039842, dated Jan. 24, 2020.
IPI, Hearing Notice for IN Application No. 201737001350, Mar. 17, 2021.
SIPO, First Office Action for CN Application No. 202010028392.8, dated Jan. 6, 2021.
JPO, Decision to Grant Patent for JP Application No. 2017-564896, dated May 28, 2019.
JPO, Office Action for JP Application No. 2017-564896, dated Dec. 4, 2018.
KIPO, Office Action for KR Application No. 10-2017-7036990, dated Aug. 24, 2020.
SIPO, First Office Action for CN Application No. 201680001814.4, dated Sep. 3, 2018.
SIPO, Second Office Action for CN Application No. 201680001814.4, dated Apr. 17, 2019.
EPO, Extended European Search Report for EP Application No. 16819788.7, dated Nov. 15, 2017.
EPO, Communication for EP Application No. 16819788.7, dated Mar. 5, 2020.
JPO, Office Action for JP Application No. 2017-514512, dated Sep. 4, 2018.
JPO, Rejection Decision for JP Application No. 2017-514512, dated Apr. 23, 2019.
JPO, Office Action for JP Application No. 2019-152040, dated Oct. 6, 2020.
KIPO, Office Action for KR Application No. 10-2017-7002310, dated Jun. 26, 2018.
KIPO, Office Action for KR Application No. 10-2017-7002310, dated Jan. 29, 2018.
USPTO, First Non Final Office Action for U.S. Appl. No. 15/406,017, dated Jun. 27, 2019.
USPTO, Second Non Final Office Action for U.S. Appl. No. 15/406,017, dated Feb. 5, 2020.
USPTO, Third Non Final Office Action for U.S. Appl. No. 15/406,017, dated Oct. 7, 2020.
USPTO, First Final Office Action for U.S. Appl. No. 15/406,017, dated Oct. 31, 2019.
USPTO, Second Final Office Action for U.S. Appl. No. 15/406,017, dated Jun. 24, 2020.
USPTO, Advisory Action for U.S. Appl. No. 15/406,017, dated Sep. 4, 2020.
WIPO, ISR for PCT/CN2016/073679, dated Nov. 10, 2016.
KIPO, Notice of Allowance for KR Application No. 10-2017-7002310, dated Aug. 24, 2018.
USPTO, Office Action for U.S. Appl. No. 15/406,017, dated Apr. 26, 2021.
USPTO, Office Action issued in U.S. Appl. No. 15/406,017, dated Aug. 24, 2021.
USPTO, Final Office Action for U.S. Appl. No. 15/406,017, dated Apr. 5, 2022.
Chen, "A Design of an Optimal Battery Pulse Charge System by Frequency-Varied Technique", IEEE Transactions on Industrial Electronics, vol. 54, No. 1, Feb. 2007, pp. 398-405.
KIPO, Office Action for KR Application No. 20177002310, dated Jun. 26, 2018.
KIPO, Office Action for KR Application No. 20177002310, dated Jan. 29, 2018.
IPOS, Office Action for SG Application No. 11201700428U, dated Nov. 23, 2017.
APO, Office Action for AU Application No. 2016291545, dated Jun. 25, 2018.
EPO, Office Action for EP Application No. 16819788, dated Nov. 15, 2017.
WIPO, English Translation of the ISR/WO for CN Application No. PCT/CN2016/073679, dated Nov. 10, 2016.
CNIPA, Second Office Action for CN Application No. 201780004527.3, dated Aug. 19, 2022.
CNIPA, Second Office Action for CN Application No. 201780004510.8, dated Aug. 16, 2022.
CNIPA, Rejection Decision for CN Application No. 201780004510.8, dated Nov. 2, 2022.

* cited by examiner

DEVICE CHARGING SYSTEM, CHARGING METHOD, AND POWER ADAPTER

CROSS REFERENCE TO RELATED APPLICATION

This application is a continuation of International Application No. PCT/CN2017/070537 filed on Jan. 7, 2017, which claims priority to International Application No. PCT/CN2016/073679 filed Feb. 5, 2016 and claims priority to Chinese Patent Application No. 201610600612.3 filed Jul. 26, 2016. The disclosures of each of the foregoing applications are hereby incorporated by reference in their entirety.

TECHNICAL FIELD

The present disclosure generally relates to a device technical field, and more particularly, to a charging system, a charging method and a power adapter.

BACKGROUND

Nowadays, mobile devices such as smart phones are favored by more and more consumers. However, the mobile device consumes large power energy, and needs to be charged frequently.

Typically, the mobile device is charged by a power adapter. The power adapter generally includes a primary rectifier circuit, a primary filter circuit, a transformer, a secondary rectifier circuit, a secondary filter circuit and a control circuit, such that the power adapter converts the input alternating current of 220V into a stable and low voltage direct current (for example, 5V) suitable for requirements of the mobile device, and provides the direct current to a power management device and a battery of the mobile device, thereby realizing charging the mobile device.

However, with the increasing of the power of the power adapter, for example, from 5 W to larger power such as 10 W, 15 W, 25 W, it needs more electronic elements capable of bearing large power and realizing better control for adaptation, which not only increases a size of the power adapter, but also increases a production cost and manufacture difficulty of the power adapter.

SUMMARY

Embodiments of the present disclosure provide a charging system. The charging system includes: a battery; a first rectification unit, configured to rectify an input alternating current and output a voltage with a first pulsating waveform; a switch unit, configured to modulate the voltage with the first pulsating waveform according to a control signal; a transformer, configured to output a voltage with a second pulsating waveform according to the modulated voltage with the first pulsating waveform; a second rectification unit, configured to rectify the voltage with the second pulsating waveform to output a voltage with a third pulsating waveform, in which the voltage with the third pulsating waveform is configured to be applied to the battery for charging the battery; and a control unit, coupled to the switch unit, and configured to output the control signal to the switch unit and to adjust a duty ratio of the control signal such that the voltage with the third pulsating waveform meets a charging requirement of the battery. The control unit is configured to, during a process that the power adaptor charges the battery by outputting the voltage with the third pulsating waveform to the battery, adjust the duty ratio of the control signal to decrease a length of a valley of the voltage with the third pulsating waveform such that a peak value of a voltage of the battery is sampled.

Embodiments of the present disclosure provide a power adapter. The power adapter includes: a first rectification unit, configured to rectify an input alternating current and output a voltage with a first pulsating waveform; a switch unit, configured to modulate the voltage with the first pulsating waveform according to a control signal; a transformer, configured to output a voltage with a second pulsating waveform according to the modulated voltage with the first pulsating waveform; a second rectification unit, configured to rectify the voltage with the second pulsating waveform to output a voltage with a third pulsating waveform, in which the voltage with the third pulsating waveform is configured to be applied to a battery in a device for charging the battery of the device; and a control unit, coupled to the switch unit, and configured to output the control signal to the switch unit and to adjust a duty ratio of the control signal such that the voltage with the third pulsating waveform meets a charging requirement. During a process that the power adaptor charges the battery by outputting the voltage with the third pulsating waveform to the battery, the control unit is further configured to adjust the duty ratio of the control signal to decrease a length of a valley of the voltage with the third pulsating waveform such that sample a peak value of a voltage of the battery is sampled.

Embodiments of the present disclosure provide a charging method. The method includes: performing a first rectification on an input alternating current to output a voltage with a first pulsating waveform; modulating the voltage with the first pulsating waveform; outputting a voltage with a second pulsating waveform according to the modulated voltage with the first pulsating waveform; performing a second rectification on the voltage with the second pulsating waveform to output a voltage with a third pulsating waveform; applying the voltage with the third pulsating waveform to a battery of a; adjusting a duty ratio of a control signal for modulating the voltage with the first pulsating waveform such that the voltage with the third pulsating waveform meets a charging requirement; and during a process that the power adaptor charges the battery by outputting the voltage with the third pulsating waveform to the battery, decreasing a length of a valley of the voltage of the third pulsating waveform by adjusting the duty ratio of the control signal for modulating the voltage with the first pulsating waveform such that a peak value of a voltage of the battery is sampled.

DETAILED DESCRIPTION

Figure 1A:
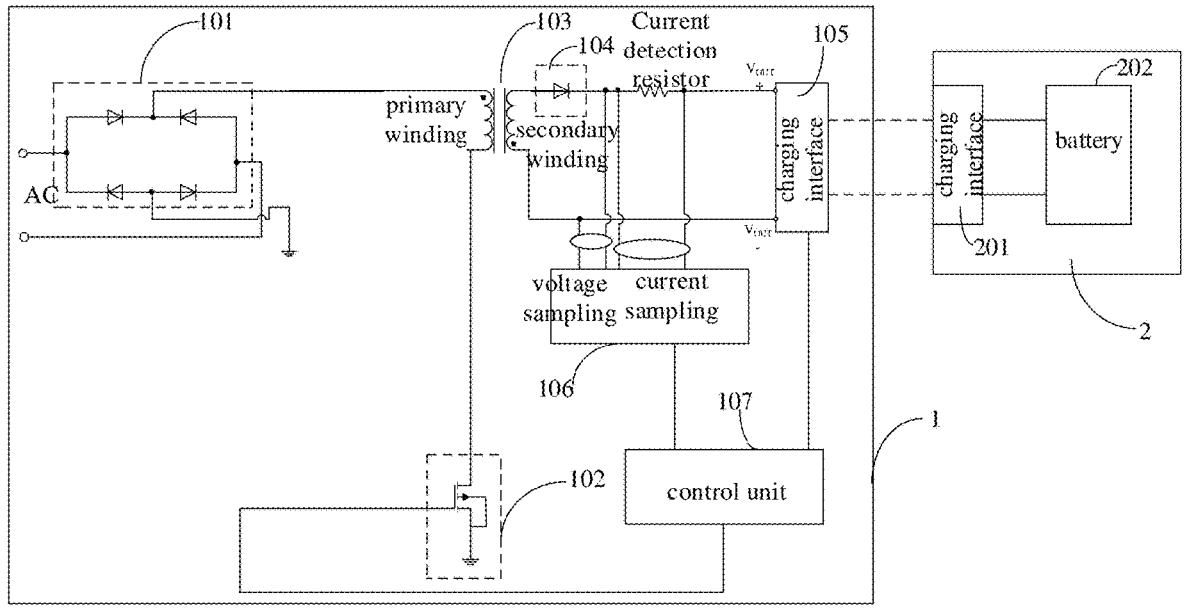
FIG. 1A is a schematic diagram illustrating a charging system using a flyback switching power supply according to an embodiment of the present disclosure.

Descriptions will be made in detail to embodiments of the present disclosure, examples of which are illustrated in drawings, in which the same or similar elements and the elements having same or similar functions are denoted by like reference numerals throughout the descriptions. The embodiments described herein with reference to drawings are explanatory, are intended to understand the present disclosure, and are not construed to limit the present disclosure.

The present disclosure is made based on following understanding and researches.

The inventors found that, during charging a battery of a mobile device by a power adapter, as the power of the power adapter becomes larger, it is easy to increase polarization resistance and temperature of the battery, thus reducing a service life of the battery, and affecting a reliability and a safety of the battery.

Moreover, most devices cannot work directly with an alternating current (AC) when powered through an AC power supply, because the AC such as mains supply of 220V/50 Hz outputs electric energy discontinuously. In order to avoid such discontinuity, it needs to use an electrolytic capacitor to store the electric energy, such that when the power supply is in a valley period, it is possible to ensure the continuity of power supply rely on the electric energy stored in the electrolytic capacitor. Thus, when an AC power source charges the mobile device via the power adapter, the AC such as the AC of 220V provided by the AC power source is converted into a stable direct current (DC), and the stable DC is provided to the mobile device. However, the power adapter charges the battery in the mobile device so as to supply power to the mobile device indirectly, and the continuity of power supply can be guaranteed by the battery, such that it is unnecessary for the power adapter to output a stable and continue DC when charging the battery.

In addition, when the mobile device is charged by using a VOOC (Voltage Open Loop Multi-step Constant-Current Charging) method with a low voltage and a high current in related arts, the power adaptor is directly coupled to the battery and an outputted voltage and current are adjusted by the power adaptor. Therefore, the power adaptor needs to acquire information, such as a voltage of the battery. The power adaptor judges whether the acquired voltage of the battery reaches a target voltage. When the voltage of the battery reaches the target voltage, the power adaptor starts to decrease the outputted current. However, the information, such as the voltage of the battery, is acquired through an ADC (Analog to Digital Converter) and a sampled voltage is instantaneous. In a case that the sampled voltage is instantaneous, it is feasible to use the sampled voltage in a DC charging process. However, in a pulsating charging process, there may be a problem. Because an inputted current is pulsating, and there is an internal resistor of the battery, the voltage of the battery fluctuates with a fluctuation of waveforms of the pulsed current. Thus, the voltage of the battery has a peak and a valley. In order to avoid an overvoltage of the battery, it is necessary to ensure that a peak voltage of the battery is not over-voltage. However, the sampled voltage is instantaneous by adopting the above-discussed method, and if the sampled voltage is the valley, a real-time adjustment performed by the charging system may be affected.

Before describing a charging system, a power adapter, a charging method provided in embodiments of the present disclosure, a power adapter that is configured to charge a device to be charged (such as the device) in the related art is described first, which is hereinafter referred to as a "related adapter".

The related adapter is suitable for working in a constant voltage mode. In the constant voltage mode, a voltage outputted by the related adapter is basically constant, such as 5V, 9V, 12V or 20V, etc.

The voltage outputted by the related adapter is unsuitable for being directly applied to two ends of a battery. It is required to convert the voltage by a conversion circuit in the device to be charged (such as the device) to obtain a charging voltage and/or charging current expected by the battery in the device to be charged (such as the device).

The conversion circuit is configured to convert the voltage outputted by the related adapter, so as to meet requirements for the charging voltage and/or the charging current expected by the battery.

As an example, the conversion circuit may be a charging management module, such as a charging integrated circuit (IC) in the device. During a process of charging the battery, the conversion circuit may be configured to manage the charging voltage and/or the charging current of the battery. The conversion circuit has functions of a voltage feedback module and/or functions of a current feedback module, so as to realize a management on the charging voltage and/or the charging current of the battery.

For example, the process of charging the battery may include at least one of a trickle charging stage, a constant current charging stage and a constant voltage charging stage. In the trickle charging stage, the conversion circuit may be configured to utilize a current feedback loop to ensure that a current flowing into the battery within the trickle charging stage meets the charging current (such as a first charging current) expected by the battery. In the constant current charging stage, the conversion circuit may be configured to utilize a current feedback loop to ensure that a current flowing into the battery within the constant current charging stage meets the charging current (such as a second charging current, which may be greater than the first charging current) expected by the battery. In the constant voltage charging stage, the conversion circuit may be configured to utilize a voltage feedback loop to ensure that a voltage applied to two ends of the battery within the constant voltage charging stage meets the charging voltage expected by the battery.

As an example, when the voltage outputted by the related adapter is greater than the charging voltage expected by the battery, the conversion circuit may be configured to perform buck conversion on the voltage outputted by the related adapter, such that a buck-converted voltage meets the requirement of the charging voltage expected by the battery. As another example, when the voltage outputted by the related adapter is less than the charging voltage expected by the battery, the conversion circuit may be configured to perform boost conversion on the voltage outputted by the related adapter, such that a boost-converted voltage meets the requirement of the charging voltage expected by the battery.

As another example, assume that the related adapter outputs a constant voltage of 5V. When the battery includes a single battery cell (such as a lithium battery cell, a charging cut-off voltage of the single battery cell is 4.2V), the conversion circuit (for example, a buck circuit) may perform the buck conversion on the voltage outputted by the related adapter, such that the charging voltage obtained after the buck conversion meets the requirement of the charging voltage expected by the battery.

As yet another example, assume that the related adapter outputs a constant voltage of 5V. When the related adapter charges a battery including two or more battery cells (such as two or more lithium battery cells, a charging cut-off voltage of a single battery cell is 4.2V) coupled in series, the conversion circuit (for example, a boost circuit) may perform the boost conversion on the voltage outputted by the related adapter, such that the charging voltage obtained after the boost conversion meets the requirement of the charging voltage expected by the battery.

Limited by poor conversion efficiency of the conversion circuit, an unconverted part of electric energy is dissipated in a form of heat, and this part of heat may gather inside the device to be charged (such as the device). A design space and a cooling space of the device to be charged (such as the device) are small (for example, a physical size of a mobile device used by a user becomes thinner and thinner, while plenty of electronic components are densely arranged in the mobile device to improve performance of the mobile device), which not only increases difficulty in designing the conversion circuit, but also results in that it is hard to dissipate the heat gathered in the device to be charged (such as the device) in real time, thus further causing abnormity of the device to be charged (such as the device).

For example, heat gathered on the conversion circuit may cause thermal interference on electronic components neighboring the conversion circuit, thus causing abnormal operations of the electronic components; and/or for another example, heat gathered on the conversion circuit may shorten service lifespan of the conversion circuit and neighboring electronic components; and/or for yet another example, heat gathered on the conversion circuit may cause thermal interference on the battery, thus causing abnormal charging and discharging of the battery; and/or for still another example, heat gathered on the conversion circuit may increase temperature of the device to be charged (such as the device), thus affecting user experience during the charging; and/or for still yet another example, heat gathered on the conversion circuit may short-circuit the conversion circuit, such that the voltage outputted by the related adapter is directly applied to two ends of the battery, thus causing over-voltage charging of the battery, which even brings safety hazard, for example, the battery may explode, if the over-voltage charging lasts for a long time period.

A power adapter provided in embodiments of the present disclosure may obtain status information of the battery. The status information of the battery may at least include electric quantity information and/or voltage information of the battery. The power adapter may adjust the voltage outputted by itself according to the obtained status information of the battery, to meet the requirement of the charging voltage and/or the charging current expected by the battery. Further, the output voltage of the power adapter after the adjustment may be directly applied to two ends of the battery for charging the battery. The output voltage of the power adapter is one with a pulsating waveform.

The power adapter may have functions of a voltage feedback module and/or functions of a current feedback module, so as to realize management on the charging voltage and/or the charging current of the battery.

In some embodiments, the power adapter may adjust the voltage outputted by the power adapter according to the obtained status information of the battery as follows. The power adapter may obtain the status information of the battery in real time, and adjust the voltage outputted by itself according to the status information of the battery obtained in real time, to meet the charging voltage and/or the charging current expected by the battery.

The power adapter may adjust the voltage outputted by itself according to the status information of the battery obtained in real time as follows. With the increasing of the charging voltage of the battery during the charging process, the power adapter may obtain status information of the battery at different time points in the charging process, and adjust the voltage outputted by itself in real time according to the status information of the battery, to meet the requirement of the charging voltage and/or the charging current expected by the battery. The output voltage of the power adapter after the adjustment may be directly applied to two ends of the battery for charging the battery.

For example, the process of charging the battery may include at least one of a trickle charging stage, a constant current charging stage and a constant voltage charging stage. In the trickle charging stage, the power adapter may be configured to output the first charging current within the trickle charging stage to charge the battery, so as to meet the requirement of the charging current expected by the battery (the first charging current may be one with a pulsating waveform). In the constant current charging stage, the power adapter may be configured to utilize the current feedback loop to ensure that the current outputted by the power adapter and flowing into the battery within the constant current charging stage meets the requirement of the charging current expected by the battery (such as the second charging current, which also may be one with a pulsating waveform. The second charging current may be greater than the first charging current. That is, a current peak of the pulsating waveform in the constant current charging stage is greater than that in the trickle charge stage, and the constant current in the constant current charging phase may refer to the current peak or a current average value of the pulsating waveform remains substantially constant). In the constant voltage charging stage, the power adapter may be configured to utilize the voltage feedback loop to ensure that the voltage (the voltage with the pulsating waveform) outputted within the constant voltage charging stage from the power adapter to the device to be charged (such as the device) remains constant.

For example, the power adapter provided in embodiments of the present disclosure may be configured to control the constant current charging stage of the battery within the device to be charged (such as the device) mainly. In other embodiments, a control function of the trickle charging stage and the constant voltage charging stage of the battery within the device to be charged (such as the device) may be completed collaboratively by the power adapter provided in embodiments of the present disclosure and an additional charging chip in the device to be charged (such as the device). Compared to the constant current charging stage, a charging power acceptable by the battery during the trickle charging stage and the constant voltage charging stage is small, and efficiency conversion loss and heat accumulation of the charging chip within the device to be charged (such as the device) is acceptable. It is to be noted that, the constant current charging stage or the constant current stage provided in embodiments of the present disclosure may refer to a charging mode for controlling the output current of the power adapter and does not require that the output current of the power adapter be kept completely constant, for example, it can be referred to that the current peak or the current average value of the pulsating waveform outputted by the power adapter remain essentially unchanged, or remain basically unchanged for a period of time. For example, in practice, the power adapter typically adopts a multi-stage constant current mode for charging during the constant current charging mode.

The multi-stage constant current charging may include N charging stages, where N is an integer no less than 2. The first charging stage of the multi-stage constant current charging starts with a predetermined charging current. N constant charging stages in the multi-stage constant current charging are performed in sequence from the first charging stage to the $(N-1)^{th}$ charging stage. After the charging stage is switched from one charging stage to a next charging stage, the current peak or the current average value of the pulsating waveform may be decreased. When the voltage of the battery reaches a charging stop voltage threshold, the charging stage is switched from the present charging stage to the next charging stage. The current conversion process between two adjacent constant stages may be gradual, or step-by-step.

Further, it is to be noted that, the device applied in embodiments of the present disclosure includes, but is not limited to a device configured to receive/transmit communication signals via wired connection (for example, public switched telephone network (PSTN), digital subscriber line (DSL), digital cable, a direct cable and/or another data connection/network) and/or via a wireless interface (for example, cellular network, wireless local area network (WLAN), digital TV network such as digital video broadcasting handheld (DVB-H) network, satellite network, an amplitude modulation-frequency modulation (AM-FM) broadcasting transmitter, and/or a wireless interface of another communication device). The communication device configured to communicate via the wireless interface may be referred to as "wireless communication device", "wireless device" and/or "mobile device". Examples of the mobile device include, but are not limited to a satellite phone or a cell phone, a device combining a cell radio phone and a personal communication system (PCS) having capability of data process, fax, and data communication, a personal digital assistant (PDA) including a radio phone, a pager, an Internet/Intranet access, a web browser, a notepad & address book, a calendar and/or a global positioning system (GPS) receiver, and a common laptop and/or handheld receiver, or other electronic device including a radio phone transceiver.

In addition, in embodiments of the present disclosure, the voltage with the pulsating waveform output from the power adapter is directly applied to the battery of the device for charging the battery, and the charging current is represented by the pulsating waveform, for example, a steamed-bun shaped waveform. It is to be understood that, the charging current may charge the battery intermittently, and the cycle of the charging current may vary with frequency of the input alternating current, such as power grid, for example, the frequency corresponding to the cycle of the charging current may be an integral multiple or a fraction of the frequency of the power grid. In addition, when the charging current charges the battery intermittently, the current waveform corresponding to the charging current may consist of one pulse or one set of pulses synchronous to the power grid.

In the following, a charging system, a power adapter and a charging method provided in embodiments of the present disclosure will be described with reference to drawings.

Referring to FIGS. 1A-14, the charging system provided in embodiments of the present disclosure includes a power adapter 1 and a device 2.

Figure 2:
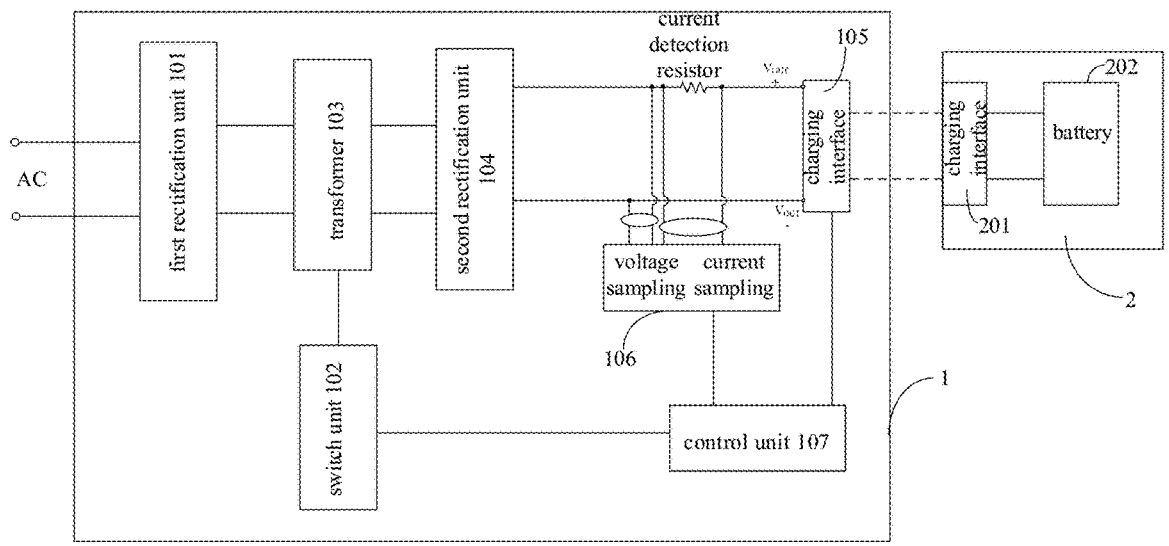
FIG. 2 is a block diagram of a charging system according to embodiments of the present disclosure.

As illustrated in FIG. 2, the power adapter 1 includes a first rectification unit 101, a switch unit 102, a transformer 103, a second rectification unit 104, a sampling unit 106, and a control unit 107. The first rectification unit 101 is configured to rectify an input alternating current (mains supply, for example AC 220V) to output a voltage with a first pulsating waveform, for example a voltage with a steamed-bun shaped waveform. As illustrated in FIG. 1A, the first rectification unit 101 may be a full-bridge rectifier circuit consisting of four diodes. The switch unit 102 is configured to modulate the voltage with the first pulsating waveform according to a control signal. The switch unit 102 may consist of MOS transistors. A PWM (Pulse Width Modulation) control is performed on the MOS transistors to perform a chopping modulation on the voltage with the steamed-bun shaped waveform. The transformer 103 is configured to output a voltage with a second pulsating waveform according to the modulated voltage with the first pulsating waveform. The second rectification unit 104 is configured to rectify the voltage with the second pulsating waveform and output a voltage with a third pulsating waveform. The second rectification unit 104 may consist of diodes or MOS transistors, and can realize a secondary synchronous rectification, such that the third pulsating waveform keeps synchronous with a waveform of the modulated voltage with the first pulsating waveform. It should be noted that, the third pulsating waveform keeping synchronous with the waveform of the modulated voltage with the first pulsating waveform means that, a phase of the third pulsating waveform is consistent with that of the waveform of the modulated voltage with the first pulsating waveform, and a variation trend of magnitude of the third pulsating waveform is consistent with that of the waveform of the modulated voltage with the first pulsating waveform. The sampling unit 106 is configured to sample a voltage and/or a current outputted by the second rectification unit 104 so as to obtain a voltage sampling value and/or a current sampling value. The control unit 107 is coupled to the sampling unit 106 and the switch unit 102 respectively. The control unit 107 is configured to output the control signal to the switch unit 102 and to adjust a duty ratio of the control signal according to the current sampling value and/or the voltage sampling value, such that the voltage with the third pulsating waveform outputted by the second rectification unit 104 meets a charging requirement.

Further, in an embodiment of the present disclosure, the power adapter further includes a first charging interface 105. The first charging interface 105 is coupled to the second rectification unit 104. The first charging interface 105 is configured to apply the voltage with the third pulsating waveform to the battery in the device via a second charging interface of the device when the first charging interface 105 is coupled to the second charging interface, in which the second charging interface is coupled to the battery.

As illustrated in FIG. 2, the device 2 includes a battery 202.

In an embodiment, the device 2 further includes a second charging interface 201. The second charging interface 201 is coupled to the battery 202. When the second charging interface 201 is coupled to the first charging interface 105, the second charging interface 201 is configured to apply the voltage with the third pulsating waveform to the battery 202, so as to charge the battery 202.

Furthermore, the device includes a battery voltage sampling unit. The battery voltage sampling unit is configured to sample the voltage of the battery. During a process that the power adaptor 1 charges the battery by outputting the voltage with the third pulsating waveform, the control unit 107 is configured to reduce a length of a valley of the voltage with the third pulsating waveform by controlling the duty ratio of the control signal, such that the battery voltage sampling unit is configured to sample a peak value of the voltage of the battery. The battery voltage sampling unit includes an electric meter. The voltage of the battery is sampled by the electric meter.

In other words, during the process that the power adapter charges the battery by outputting the voltage with the third pulsating waveform, as the battery is charged with pulsating waveforms, it may not guarantee that the peak value of the voltage of the battery is sampled precisely each time through the battery voltage sampling unit. When the battery is charged with the pulsating waveforms, if the charging current is stopped, the charging current does not drop to zero immediately, but is decreased slowly. The shorter the stopped period, the less the change in the charging voltage. Therefore, in embodiments of the present disclosure, the control unit 107 is configured to decrease the length of the valley of the voltage with the third pulsating waveform by adjusting the duty ratio of the control signal, thereby reducing a voltage difference between the peak value and the valley value of the voltage of the battery. Thus, the fluctuation of the voltage of the battery is effectively reduced when the battery is charged with pulsating waveforms, which is contributed to sample the peak value of the voltage of the battery, thereby ensuring the safety and reliability of the charging system. For example, as illustrated in FIG. 5B, a comparison between a PWM signal without an adjustment and a PWM signal with the adjustment is illustrated. The control unit 107 is configured to decrease the length of the valley of the voltage with the third pulsating waveform by controlling the duty ratio of the control signal. The duty ratio of the PWM signal is adjusted as large as possible, thus the length of the valley of the voltage with the third pulsating waveform is adjusted as less as possible. Therefore, the voltage difference between the peak value and the valley value of the voltage of the battery is reduced, thus reducing the fluctuation of the voltage of the battery when the battery is charged with pulsating waveform, which is contributed to sample the value peak of the voltage of the battery by the battery voltage sampling unit.

In an embodiment of the present disclosure, as illustrated in FIG. 1A, the power adapter 1 may adopt a flyback switching power supply. In detail, the transformer 103 includes a primary winding and a secondary winding. An end of the primary winding is coupled to a first output end of the first rectification unit 101. A second output end of the first rectification unit 101 is grounded. Another end of the primary winding is coupled to the switch unit 102 (for example, if the switch unit 102 is a MOS transistor, the other end of the primary winding is coupled to a drain of the MOS transistor). The transformer 103 is configured to output a voltage with a second pulsating waveform according to the modulated voltage with the first pulsating waveform.

The transformer 103 is a high-frequency transformer of which a working frequency ranges from 50 KHz to 2 MHz. The high-frequency transformer is configured to couple the modulated voltage with the first pulsating waveform to the secondary side so as to output via the secondary winding. In embodiments of the present disclosure, with the high-frequency transformer, a characteristic of a small size compared to the low-frequency transformer (also known as an industrial frequency transformer, mainly used in the frequency of mains supply such as alternating current of 50 Hz or 60 Hz) may be exploited to realize miniaturization of the power adapter 1.

Figure 1B:
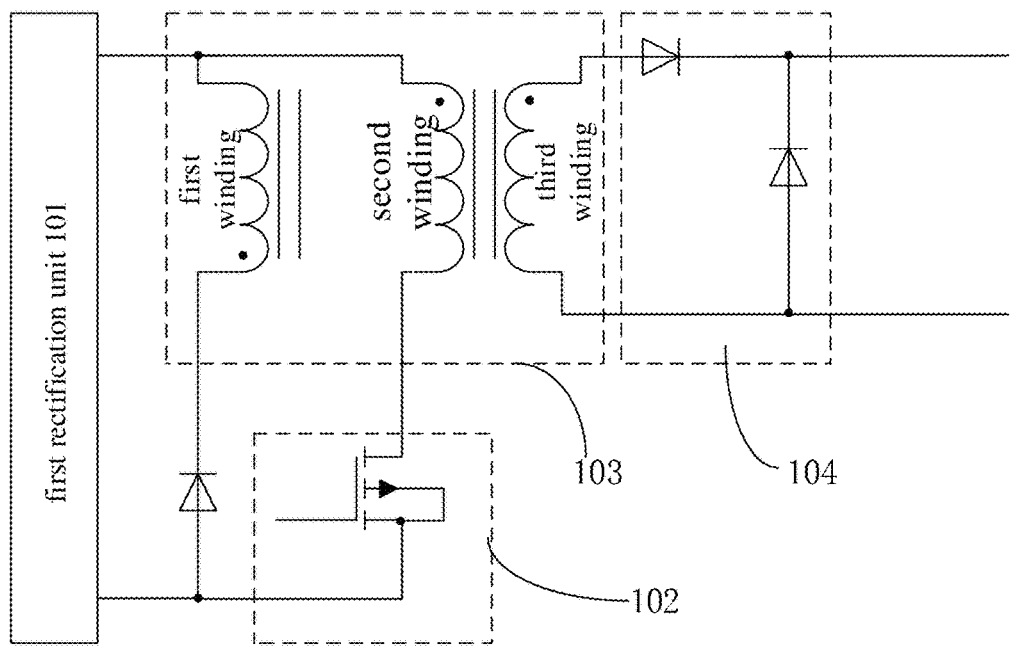
FIG. 1B is a schematic diagram illustrating a charging system using a forward switching power supply according to an embodiment of the present disclosure.

In an embodiment of the present disclosure, as illustrated in FIG. 1B, the power adapter 1 may also adopt a forward switching power supply. In detail, the transformer 103 includes a first winding, a second winding and a third winding. A dotted device of the first winding is coupled to a second output end of the first rectification unit 101 via a backward diode. A non-dotted device of the first winding is coupled to a dotted device of the second winding and then coupled to a first output end of the first rectification unit 101. A non-dotted device of the second winding is coupled to the switch unit 102. The third winding is coupled to the second rectification unit 104. The backward diode is configured to realize reverse peak clipping. An induced potential generated by the first winding may perform amplitude limiting on a reverse potential via the backward diode and return limited energy to an output of the first rectification unit 101, so as to charge the output of the first rectification unit 101. Moreover, a magnetic field generated by current flowing through the first winding may demagnetize a core of the transformer, so as to return magnetic field intensity in the core of the transformer to an initial state. The transformer 103 is configured to output the voltage with the second pulsating waveform according to the modulated voltage with the first pulsating waveform.

Figure 1C:
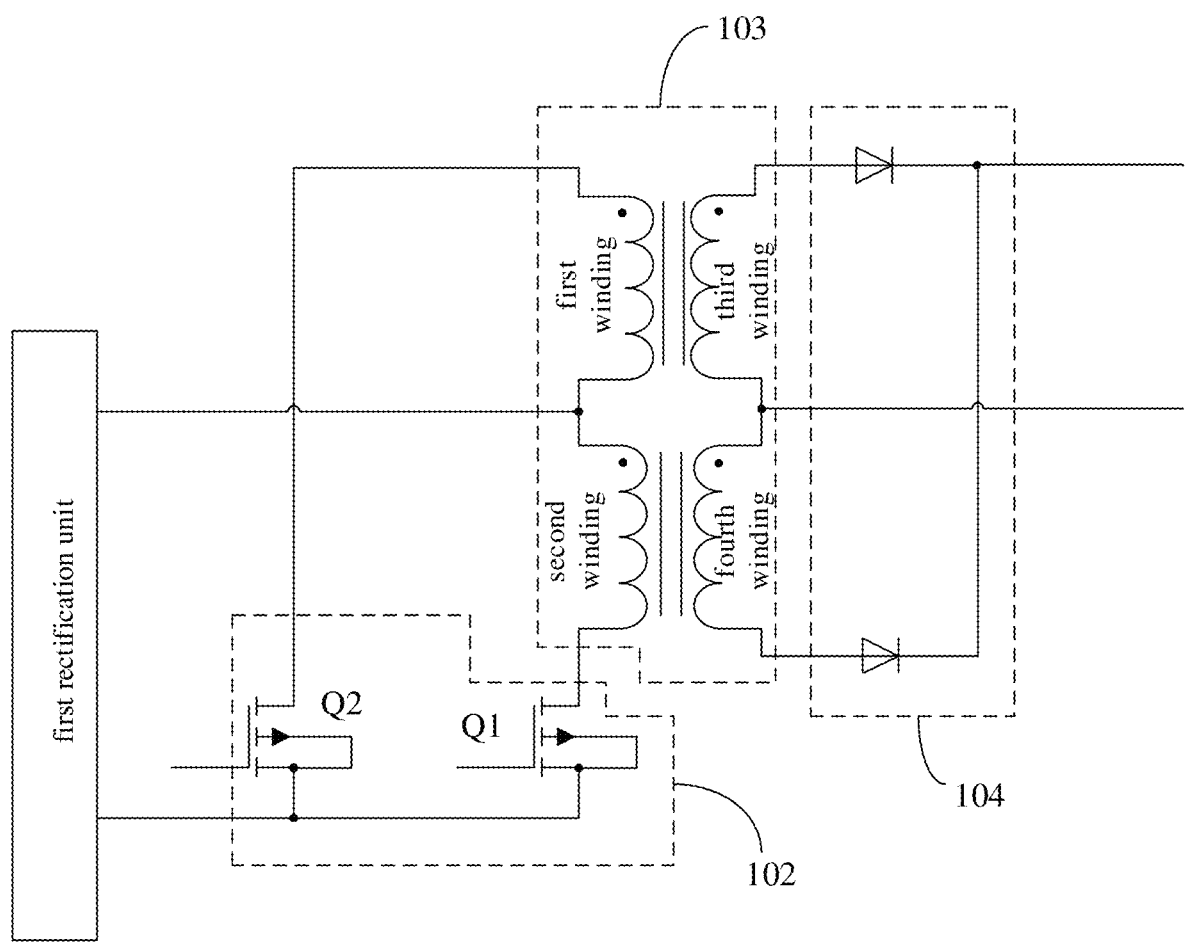
FIG. 1C is a schematic diagram illustrating a charging system using a push-pull switching power supply according to an embodiment of the present disclosure.

According to an embodiment of the present disclosure, as illustrated in FIG. 1C, the above-mentioned power adapter 1 may adopt a push-pull switching power supply. In detail, the transformer includes a first winding, a second winding, a third winding and a fourth winding. A dotted device of the first winding is coupled to the switch unit. A non-dotted device of the first winding is coupled to a dotted device of the second winding and then coupled to the first output end of the first rectification unit. A non-dotted device of the second winding is coupled to the switch unit. A non-dotted device of the third winding is coupled to a dotted device of the fourth winding. The transformer is configured to output the voltage with the second pulsating waveform according to the modulated voltage with the first pulsating waveform.

As illustrated in FIG. 1C, the switch unit 102 includes a first MOS transistor Q1 and a second MOS transistor Q2. The transformer 103 includes a first winding, a second winding, a third winding and a fourth winding. A dotted device of the first winding is coupled to a drain of the first MOS transistor Q1 in the switch unit 102. A non-dotted device of the first winding is coupled to a dotted device of the second winding. A node between the non-dotted device of the first winding and the dotted device of the second winding is coupled to the first output end of the first rectification unit 101. A non-dotted device of the second winding is coupled to a drain of the second MOS transistor Q2 in the switch unit 102. A source of the first MOS transistor Q1 is coupled to a source of the second MOS transistor Q2 and then coupled to the second output end of the first rectification unit 101. A dotted device of the third winding is coupled to a first input end of the second rectification unit 104. A non-dotted device of the third winding is coupled to a dotted device of the fourth winding. A node between the non-dotted device of the third winding and the dotted device of the fourth winding is grounded. A non-dotted device of the fourth winding is coupled to a second input end of the second rectification unit 104.

As illustrated in FIG. 1C, the first input end of the second rectification unit 104 is coupled to the dotted device of the third winding, and the second input end of the second rectification unit 104 is coupled to the non-dotted device of the fourth winding. The second rectification unit 104 is configured to rectify the voltage with the second pulsating waveform and to output the voltage with the third pulsating waveform. The second rectification unit 104 may include two diodes. An anode of one diode is coupled to the dotted device of the third winding. An anode of another diode is coupled to a non-dotted device of the fourth winding. A cathode of one diode is coupled to that of the other diode.

Figure 1D:
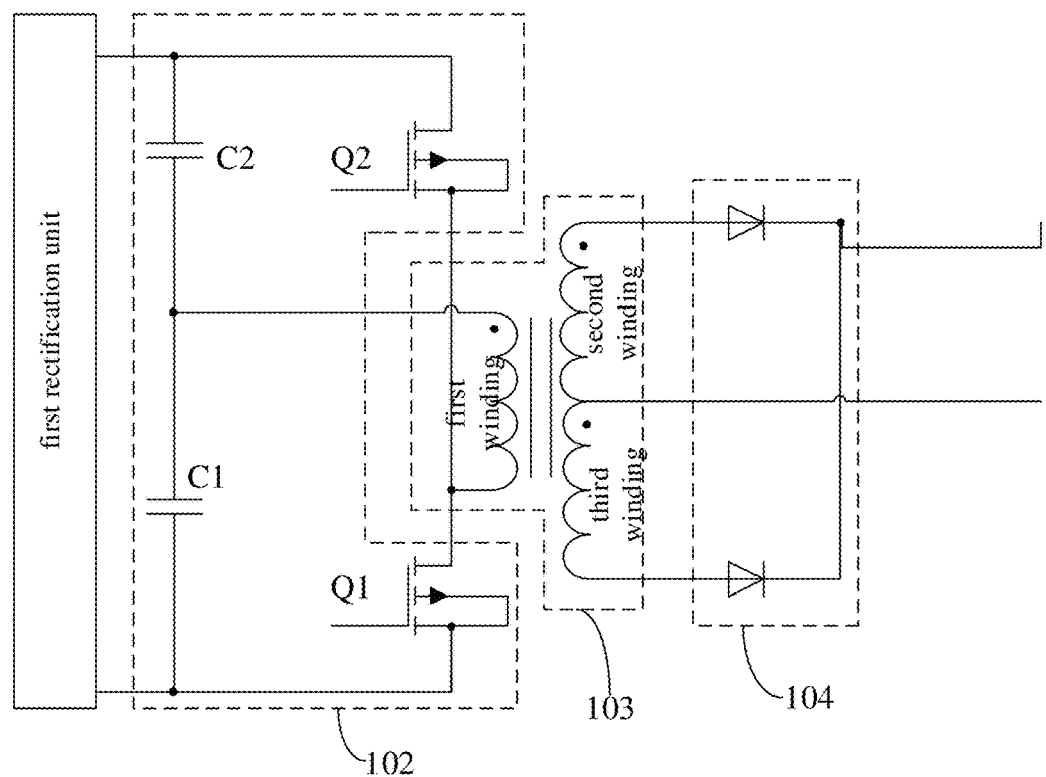
FIG. 1D is a schematic diagram illustrating a charging system using a half-bridge switching power supply according to an embodiment of the present disclosure.

According to an embodiment of the present disclosure, as illustrated in FIG. 1D, the above-mentioned power adapter 1 may also adopt a half-bridge switching power supply. In detail, the switch unit 102 includes a first MOS transistor Q1, a second MOS transistor Q2, a first capacitor C1 and a second capacitor C2. The first capacitor C1 and the second capacitor C2 are coupled in series, and then coupled in parallel to the output ends of the first rectification unit 101. The first MOS transistor Q1 and the second MOS transistor Q2 are coupled in series, and then coupled in parallel to the output ends of the first rectification unit 101. The transformer 103 includes a first winding, a second winding and a third winding. A dotted device of the first winding is coupled to a node between the first capacitor C1 and the second capacitor C2 coupled in series. A non-dotted device of the first winding is coupled to a node between the first MOS transistor Q1 and the second MOS transistor Q2 coupled in series. A dotted device of the second winding is coupled to the first input end of the second rectification unit 104. A non-dotted device of the second winding is coupled to a dotted device of the third winding, and then grounded. A non-dotted device of the third winding is coupled to the second input end of the second rectification unit 104. The transformer 103 is configured to output the voltage with the second pulsating waveform according to the modulated voltage with the first pulsating waveform.

Figure 1E:
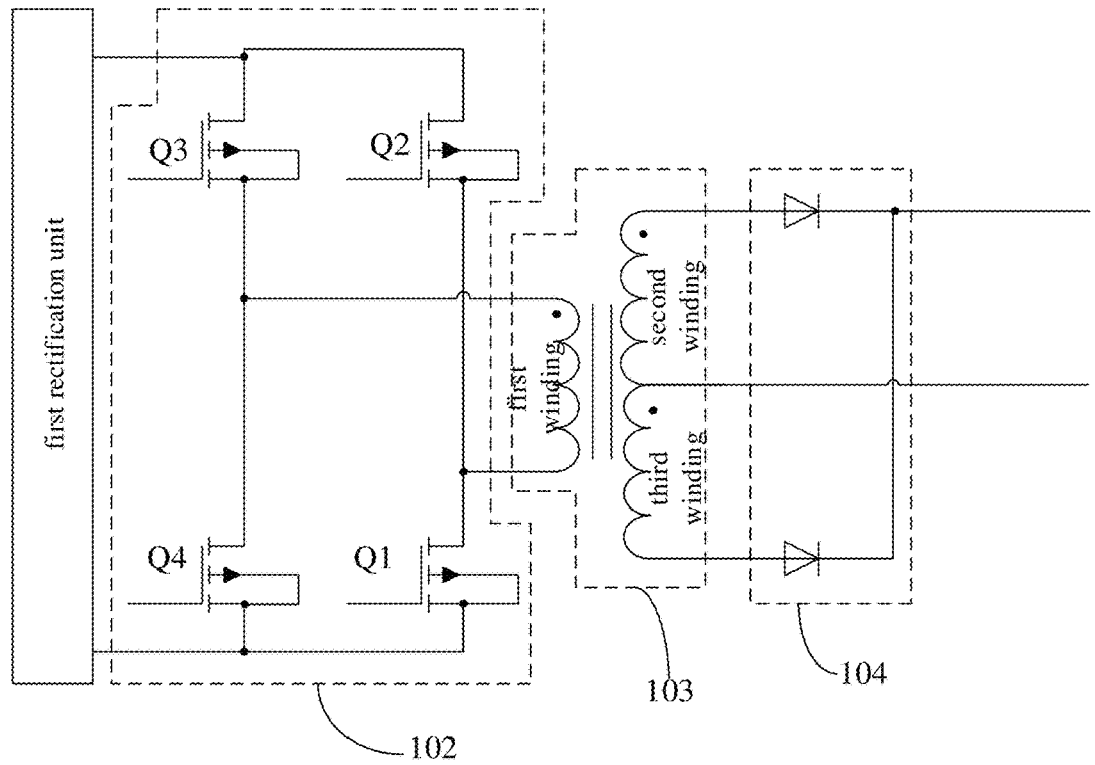
FIG. 1E is a schematic diagram illustrating a charging system using a full-bridge switching power supply according to an embodiment of the present disclosure.

According to an embodiment of the present disclosure, as illustrated in FIG. 1E, the above-mentioned power adapter 1 may also adopt a full-bridge switching power supply. In detail, the switch unit 102 includes a first MOS transistor Q1, a second MOS transistor Q2, a third MOS transistor Q3 and a fourth MOS transistor Q4. The third MOS transistor Q3 and the fourth MOS transistor Q4 are coupled in series and then coupled in parallel to the output ends of the first rectification unit 101. The first MOS transistor Q1 and the second MOS transistor Q2 are coupled in series and then coupled in parallel to the output ends of the first rectification unit 101. The transformer 103 includes a first winding, a second winding and a third winding. A dotted device of the first winding is coupled to a node between the third MOS transistor Q3 and the fourth MOS transistor Q4 coupled in series. A non-dotted device of the first winding is coupled to a node between the first MOS transistor Q1 and the second MOS transistor Q2 coupled in series. A dotted device of the second winding is coupled to the first input end of the second rectification unit 104. A non-dotted device of the second winding is coupled to a dotted device of the third winding, and then grounded. A non-dotted device of the third winding is coupled to the second input end of the second rectification unit 104. The transformer 103 is configured to output the voltage with the second pulsating waveform according to the modulated voltage with the first pulsating waveform.

Therefore, in embodiments of the present disclosure, the above-mentioned power adapter 1 may adopt any one of the flyback switching power supply, the forward switching power supply, the push-pull switching power supply, the half-bridge switching power supply and the full-bridge switching power supply to output the voltage with the pulsating waveform.

Further, as illustrated in FIG. 1A, the second rectification unit 104 is coupled to the secondary winding of the transformer 103. The second rectification unit 104 is configured to rectify the voltage with the second pulsating waveform and output a voltage with a third pulsating waveform. The second rectification unit 104 may consist of a diode, and can realize a secondary synchronous rectification, such that the third pulsating waveform keeps synchronous with a waveform of the modulated voltage with the first pulsating waveform. It should be noted that, the third pulsating waveform keeping synchronous with the waveform of the modulated voltage with the first pulsating waveform means that, a phase of the third pulsating waveform is consistent with that of the modulated voltage with the first pulsating waveform, and a variation trend of magnitude of the third pulsating waveform is consistent with that of the modulated voltage with the first pulsating waveform. The first charging interface 105 is coupled to the second rectification unit 104. The sampling unit 106 is configured to sample a voltage and/or a current output by the second rectification unit 104 to obtain a voltage sampling value and/or a current sampling value. The control unit 107 is coupled to the sampling unit 106 and the switch unit 102 respectively. The control unit 107 is configured to output the control signal to the switch unit 102, and to adjust the duty ratio of the control signal according to the voltage sampling value and/or the current sampling value, such that the voltage with the third pulsating waveform outputted by the second rectification unit 104 meets a charging requirement.

As illustrated in FIG. 1A, the device 2 includes a second charging interface 201 and a battery 202. The second charging interface 201 is coupled to the battery 202. When the second charging interface 201 is coupled to the first charging interface 105, the second charging interface 201 is configured to apply the voltage with the third pulsating waveform to the battery 202 to realize a charging of the battery 202.

Figure 3:
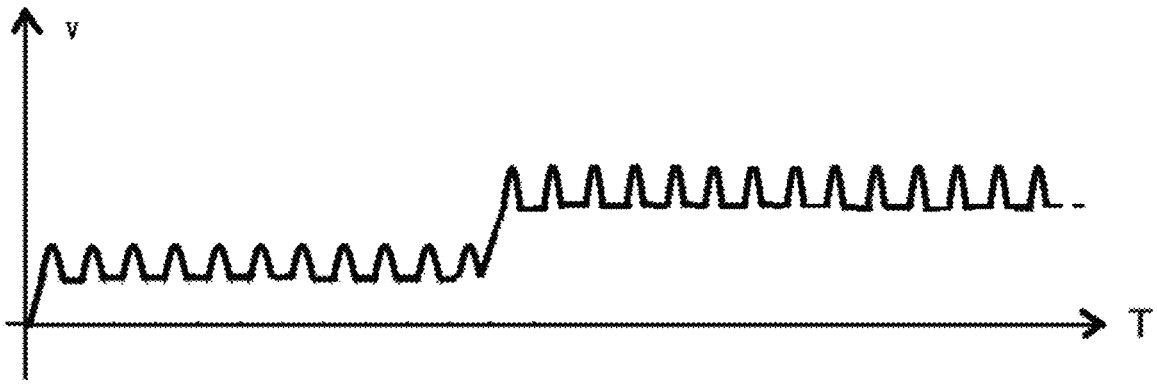
FIG. 3 is a schematic diagram illustrating a waveform of a charging voltage outputted to a battery from a power adapter according to an embodiment of the present disclosure.
Figure 4:
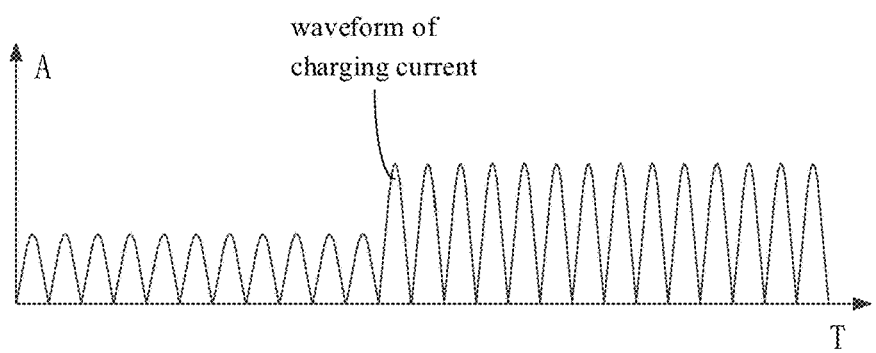
FIG. 4 is a schematic diagram illustrating a waveform of a charging current outputted to a battery from a power adapter according to an embodiment of the present disclosure.

It should be noted that, the voltage with the third pulsating waveform meeting the charging requirement means that, the voltage and current with the third pulsating waveform need to meet the charging voltage and charging current when the battery is charged. In other words, the control unit 107 is configured to adjust the duty ratio of the control signal (such as a PWM signal) according to a sampled voltage and/or current outputted by the power adapter, so as to adjust the output of the second rectification unit 104 in real time and realize a closed-loop adjusting control, such that the voltage with the third pulsating waveform meets the charging requirement of the device 2, thus ensuring the stable and safe charging of the battery 202. In detail, a waveform of a charging voltage outputted to a battery 202 is illustrated in FIG. 3, in which the waveform of the charging voltage is adjusted according to the duty ratio of the PWM signal. A waveform of a charging current outputted to a battery 202 is illustrated in FIG. 4, in which the waveform of the charging current is adjusted according to the duty ratio of the PWM signal.

It can be understood that, when adjusting the duty ratio of the PWM signal, an adjusting instruction may be generated according to the voltage sampling value, or according to the current sampling value, or according to the voltage sampling value and the current sampling value.

Therefore, in embodiments of the present disclosure, by controlling the switch unit 102, a PWM chopping modulation can be directly performed on the voltage with the first pulsating waveform i.e. the steamed-bun shaped waveform after a rectification, and then a modulated voltage is sent to the high-frequency transformer and is coupled from the primary side to the secondary side via the high-frequency transformer, and then is changed back to the voltage/current with the steamed-bun shaped waveform after a synchronous rectification. The voltage/current with the steamed-bun shaped waveform is directly transmitted to the battery so as to realize quick charging to the battery. The magnitude of the voltage with the steamed-bun shaped waveform may be adjusted according to the duty ratio of the PWM signal, such that the output of the power adapter may meet the charging requirement of the battery. It can be seen from that, the power adapter according to embodiments of the present disclosure, without providing electrolytic capacitors at the primary side and the secondary side, may directly charge the battery via the voltage with the steamed-bun shaped waveform, such that a size of the power adapter may be reduced, thus realizing miniaturization of the power adapter, and decreasing cost greatly.

In an embodiment of the present disclosure, the control unit 107 may be an MCU (micro controller unit), which means that the control unit 107 may be a micro-processor integrated with a switch driving control function, a synchronous rectification function, a voltage and current adjusting control function.

According to an embodiment of the present disclosure, the control unit 107 is further configured to adjust a frequency of the control signal according to the voltage sampling value and/or the current sampling value. That is, the control unit 107 is further configured to control to output the PWM signal to the switch unit 102 for a continuous time period, and then to stop outputting for a predetermined time period and then to restart to output the PWM signal. In this way, the voltage applied to the battery is intermittent, thus realizing intermittent charging of the battery, which can avoid a safety risks caused by heat generated when the battery is charged continuously and improves the reliability and safety of the charging to the battery.

Under a low temperature condition, since the conductivity of ions and electrons in a lithium battery decreases, it is prone to intensify the degree of polarization during a charging process for the lithium battery. A continuous charging not only makes this polarization serious but also increases a possibility of lithium precipitation, thus affecting safety performance of the battery. Furthermore, the continuous charging may accumulate heat generated due to the charging, thus leading to an increasing of internal temperature of the battery. When the temperature exceeds a certain value, performance of the battery may be limited, and safety risks may increase.

In embodiments of the present disclosure, by adjusting the frequency of the control signal, the power adapter outputs intermittently, which means that a battery resting process is introduced into the charging process, such that the lithium precipitation due to the polarization during the continuous charging is reduced and continuous accumulation of generated heat may be avoided to lower the temperature, thus ensuring the safety and reliability of charging to the battery.

Figure 5A:
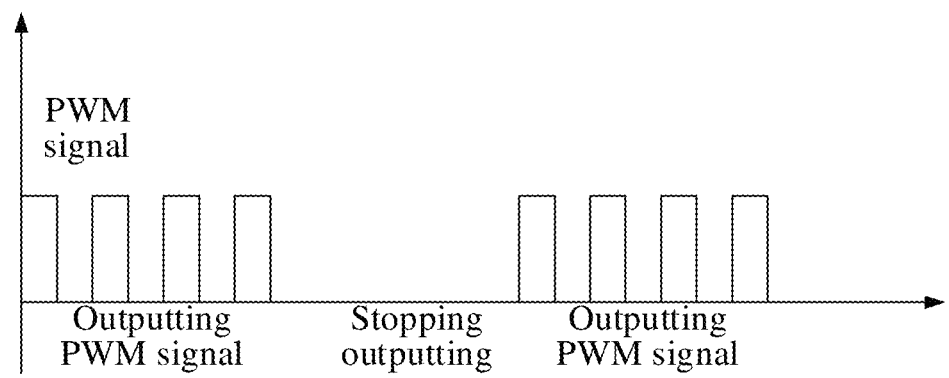
FIG. 5A is a schematic diagram illustrating a control signal outputted to a switch unit according to an embodiment of the present disclosure.
Figure 5B:
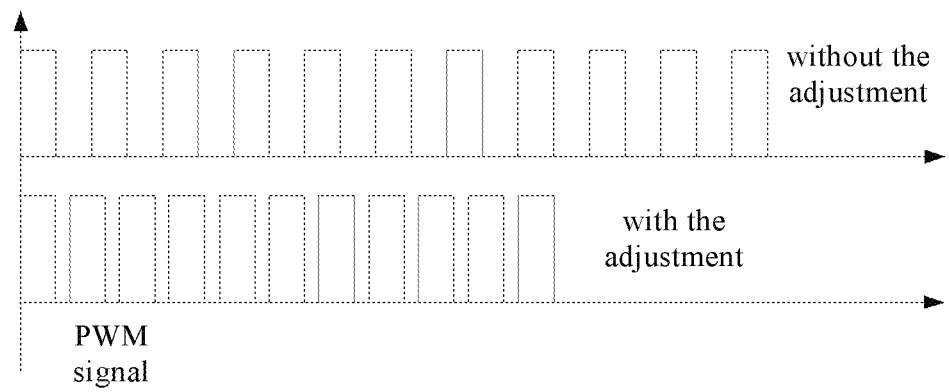
FIG. 5B is a schematic diagram illustrating a comparison between a third pulsating waveform and an adjusted third pulsating waveform with a decreased length of a valley by adjusting a duty ratio of a control signal according to an embodiment of the present disclosure.

The control signal outputted to the switch unit 102 is illustrated in FIG. 5A, for example. Firstly, the PWM signal is outputted for a continuous time period, then the output of the PWM signal is stopped for a certain time period, and then the PWM signal is outputted for a continuous time period again. In this way, the control signal outputted to the switch unit 102 is intermittent, and the frequency is adjustable.

As illustrated in FIG. 1A, the control unit 107 is coupled to the first charging interface 105. The control unit 107 is further configured to obtain status information of the device 2 by performing a communication with the device 2 via the first charging interface 105. In this way, the control unit 107 is further configured to adjust the duty ratio of the control signal (such as the PWM signal) according to the status information of the device, the voltage sampling value and/or the current sampling value.

The status information of the device may include an electric quantity of the battery, a temperature of the battery, a voltage of the battery, interface information of the device and information on path impedance of the device.

In detail, the first charging interface 105 includes a power wire and a data wire. The power wire is configured to charge the battery. The data wire is configured to communicate with the device. When the second charging interface 201 is coupled to the first charging interface 105, communication query instructions may be transmitted by the power adapter 1 and the device 2 to each other. A communication connection can be established between the power adapter 1 and the device 2 after receiving a corresponding reply instruction. The control unit 107 may obtain the status information of the device 2, so as to negotiate with the device 2 about a charging mode and charging parameters (such as the charging current, the charging voltage) and to control the charging process.

The charging mode supported by the power adapter and/or the device may include a second charging mode and a first charging mode. A charging speed of the first charging mode is faster than that of the second charging mode. For example, a charging current of the first charging mode is greater than that of the second charging mode. In general, the second charging mode may be understood as a charging mode in which a rated output voltage is 5V and a rated output current is less than or equal to 2.5 A. In addition, in the second charging mode, D+ and D− in the data wire of an output port of the power adapter may be short-circuited. On the contrary, in the first charging mode according to embodiments of the present disclosure, the power adapter may realize data exchange by communicating with the device via D+ and D− in the data wire, i.e., quick charging instructions may be sent by the power adapter and the device to each other. The power adapter sends a quick charging query instruction to the device. After receiving a quick charging reply instruction from the device, the power adapter obtains the status information of the device and enables the first charging mode according to the quick charging reply instruction. The charging current in the first charging mode may be greater than 2.5 A, for example, may be 4.5 A or more. The second charging mode is not limited in embodiments of the present disclosure. As long as the power adapter supports two charging modes, one of which has a charging speed (or current) greater than that of the other charging mode, the charging mode with a slower charging speed may be regarded as the second charging mode. As to the charging power, the charging power in the first charging mode may be greater than or equal to 15 W.

The control unit 107 communicates with the device 2 via the first charging interface 105 to determine the charging mode. The charging mode includes the first charging mode and the second charging mode.

In detail, the power adapter is coupled to the device via a universal serial bus (USB) interface. The USB interface may be a general USB interface, a micro USB interface or another typed USB interface. A data wire in the USB interface is configured as the data wire in the first charging interface, and configured for a bidirectional communication between the power adapter and the device. The data wire may be D+ and/or D− wire in the USB interface. The bidirectional communication may refer to an information interaction performed between the power adapter and the device.

The power adapter performs the bidirectional communication with the device via the data wire in the USB interface, so as to determine to charge the device in the first charging mode.

It should be noted that, during a process that the power adapter and the device negotiate whether to charge the device in the first charging mode, the power adapter may only keep a coupling with the device but does not charge the device, or charges the device in the second charging mode or charges the device with a small current, which is not limited herein.

The power adapter adjusts a charging current to a charging current corresponding to the first charging mode, and charges the device. After determining to charge the device in the first charging mode, the power adapter may directly adjust the charging current to the charging current corresponding to the first charging mode or may negotiate with the device about the charging current of the first charging mode. For example, the charging current corresponding to the first charging mode may be determined according to a current electric quantity of the battery of the device.

In embodiments of the present disclosure, the power adapter does not increase the output current blindly for quick charging, but needs to perform the bidirectional communication with the device so as to negotiate whether to adopt the first charging mode. In contrast to the related art, the safety of quick charging is improved.

As an embodiment, the control unit 107 is configured to send a first instruction to the device when performing the bidirectional communication with the device via the data wire of the first charging interface so as to determine to charge the device in the first charging mode. The first instruction is configured to query the device whether to enable the first charging mode. The control unit is configured to receive a reply instruction to the first instruction from the device. The reply instruction to the first instruction is configured to indicate that the device agrees to enable the first charging mode.

As an embodiment, before the control unit sends the first instruction to the device, the power adapter is configured to charge the device in the second charging mode. The control unit is configured to send the first instruction to the device when determining that a charging duration of the second charging mode is greater than a predetermined threshold.

It should be understood that, when the power adapter determines that the charging duration of the second charging mode is greater than the predetermined threshold, the power adapter may determine that the device has identified it as a power adapter, such that the quick charging query communication may be enabled.

As an embodiment, after determining that the device has been charged for a predetermined time period with a charging current greater than or equal to a predetermined current threshold, the power adapter is configured to send the first instruction to the device.

As an embodiment, the control unit is further configured to control the power adapter to adjust a charging current to a charging current corresponding to the first charging mode by controlling the switch unit. Before the power adapter charges the device with the charging current corresponding to the first charging mode, the control unit is configured to perform the bidirectional communication with the device via the data wire of the first charging interface to determine a charging voltage corresponding to the first charging mode, and to control the power adapter to adjust a charging voltage to the charging voltage corresponding to the first charging mode.

As an embodiment, when the control unit performs the bidirectional communication with the device via the data wire of the first charging interface to determine the charging voltage corresponding to the first charging mode, the control unit is configured to send a second instruction to the device. The second instruction is configured to query whether a current output voltage of the power adapter is suitable for being used as the charging voltage corresponding to the first charging mode. The control unit is configured to receive a reply instruction to the second instruction sent from the device. The reply instruction to the second instruction is configured to indicate that the current output voltage of the power adapter is suitable, high or low. The control unit is configured to determine the charging voltage corresponding to the first charging mode according to the reply instruction to the second instruction.

As an embodiment, before controlling the power adapter to adjust the charging current to the charging current corresponding to the first charging mode, the control unit is further configured to perform the bidirectional communication with the device via the data wire of the first charging interface to determine the charging current corresponding to the first charging mode.

As an embodiment, when performing the bidirectional communication with the device via the data wire of the first charging interface to determine the charging current corresponding to the first charging mode, the control unit is configured to send a third instruction to the device. The third instruction is configured to query a maximum charging current currently supported by the device. The control unit is configured to receive a reply instruction to the third instruction sent from the device. The reply instruction to the third instruction is configured to indicate the maximum charging current currently supported by the device. The control unit is configured to determine the charging current corresponding to the first charging mode according to the reply instruction to the third instruction.

The power adapter may determine the above maximum charging current as the charging current corresponding to the first charging mode, or may set the charging current as a charging current less than the maximum charging current.

As an embodiment, during a process that the power adapter charges the device in the first charging mode, the control unit is further configured to perform the bidirectional communication with the device via the data wire of the first charging interface, so as to continuously adjust a charging current outputted to the battery from the power adapter by controlling the switch unit.

The power adapter may query the status information of the device continuously, for example, query the voltage of the battery of the device, the electric quantity of the battery, etc., so as to adjust the charging current continuously.

As an embodiment, when the control unit performs the bidirectional communication with the device via the data wire of the first charging interface to continuously adjust the charging current outputted to the battery from the power adapter by controlling the switch unit, the control unit is configured to send a fourth instruction to the device. The fourth instruction is configured to query a current voltage of the battery in the device. The control unit is configured to receive a reply instruction to the fourth instruction sent by the device. The reply instruction to the fourth instruction is configured to indicate the current voltage of the battery in the device. The control unit is configured to adjust the charging current outputted to the battery from the power adaptor by controlling the switch unit according to the current voltage of the battery.

As an embodiment, the control unit is configured to adjust the charging current outputted to the battery from the power adapter to a charging current value corresponding to the current voltage of the battery by controlling the switch unit according to the current voltage of the battery and a predetermined correspondence between battery voltage values and charging current values.

In detail, the power adapter may store the correspondence between battery voltage values and charging current values in advance. The power adapter may also perform the bidirectional communication with the device via the data wire of the first charging interface to obtain from the device the correspondence between battery voltage values and charging current values stored in the device.

As an embodiment, during the process that the power adapter charges the device in the first charging mode, the control unit is further configured to determine whether the first charging interface and the second charging interface are in poor contact by performing the bidirectional communication with the device via the data wire of the first charging interface. When determining that the first charging interface and the second charging interface are in poor contact, the control unit is configured to control the power adapter to quit the first charging mode.

As an embodiment, before determining whether the first charging interface and the second charging interface are in poor contact, the control unit is further configured to receive from the device information indicating path impedance of the device. The control unit is configured to send a fourth instruction to the device. The fourth instruction is configured to query a current voltage of the battery in the device. The control unit is configured to receive a reply instruction to the fourth instruction sent by the device. The reply instruction to the fourth instruction is configured to indicate the current voltage of the battery in the device. The control unit is configured to determine path impedance from the power adapter to the battery according to an output voltage of the power adapter and the current voltage of the battery and determines whether the first charging interface and the second charging interface are in poor contact according to the path impedance from the power adapter to the battery, the path impedance of the device, and path impedance of a charging circuit between the power adapter and the device.

The device may record the path impedance thereof in advance. For example, since the devices in the same type have the same structure, the path impedance of each device in the same type is set to the same value when configuring factory settings. Similarly, the power adapter may record the path impedance of the charging circuit in advance. When the power adapter obtains the voltage across two ends of the battery of the device, the path impedance of the whole path can be determined according to the voltage drop cross two ends of the battery and the current of the path. When the path impedance of the whole path>the path impedance of the device+the path impedance of the charging circuit, or the path impedance of the whole path−(the path impedance of the device+the path impedance of the charging wire)>an impedance threshold, it can be considered that the first charging interface and the second charging interface are in poor contact.

As an embodiment, before the power adapter quits the first charging mode, the control unit is further configured to send a fifth instruction to the device. The fifth instruction is configured to indicate that the first charging interface and the second charging interface are in poor contact.

After sending the fifth instruction, the power adapter may quit the first charging mode or reset.

The quick charging process according to embodiments of the present disclosure has been described from the perspective of the power adapter; in the following, the quick charging process according to embodiments of the present disclosure will be described from the perspective of the device.

It should be understood that, the interaction between the power adapter and the device, relative characteristics, functions described at the device side correspond to descriptions at the power adapter side, thus repetitive description will be omitted for simplification.

Figure 13:
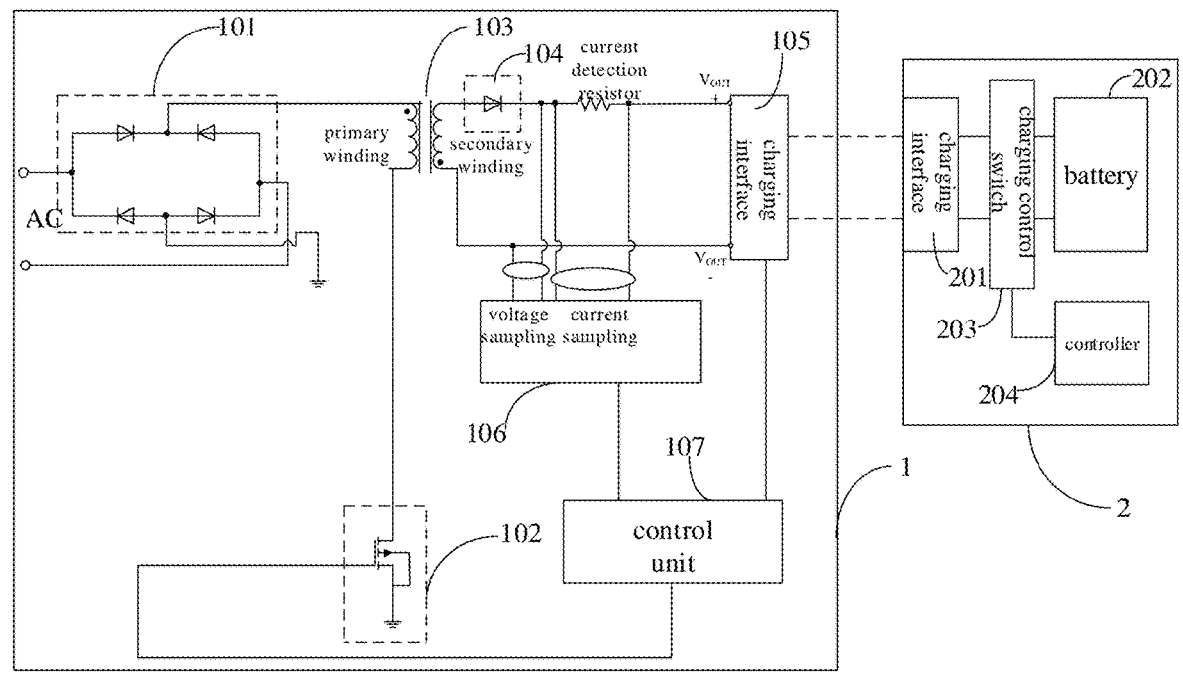
FIG. 13 is a schematic diagram of a device according to an embodiment of the present disclosure.

According to an embodiment of the present disclosure, as illustrated in FIG. 13, the device 2 further includes a charging control switch 203 and a controller 204. The charging control switch 203, such as a switch circuit consisting of an electronic switch element, is coupled between the second charging interface 201 and the battery 202, and is configured to switch on or off a charging process of the battery 202 under a control of the controller 204. In this way, the charging process of the battery 202 can be controlled at the device side, thus ensuring the safety and reliability of charging to the battery 202.

Figure 14:
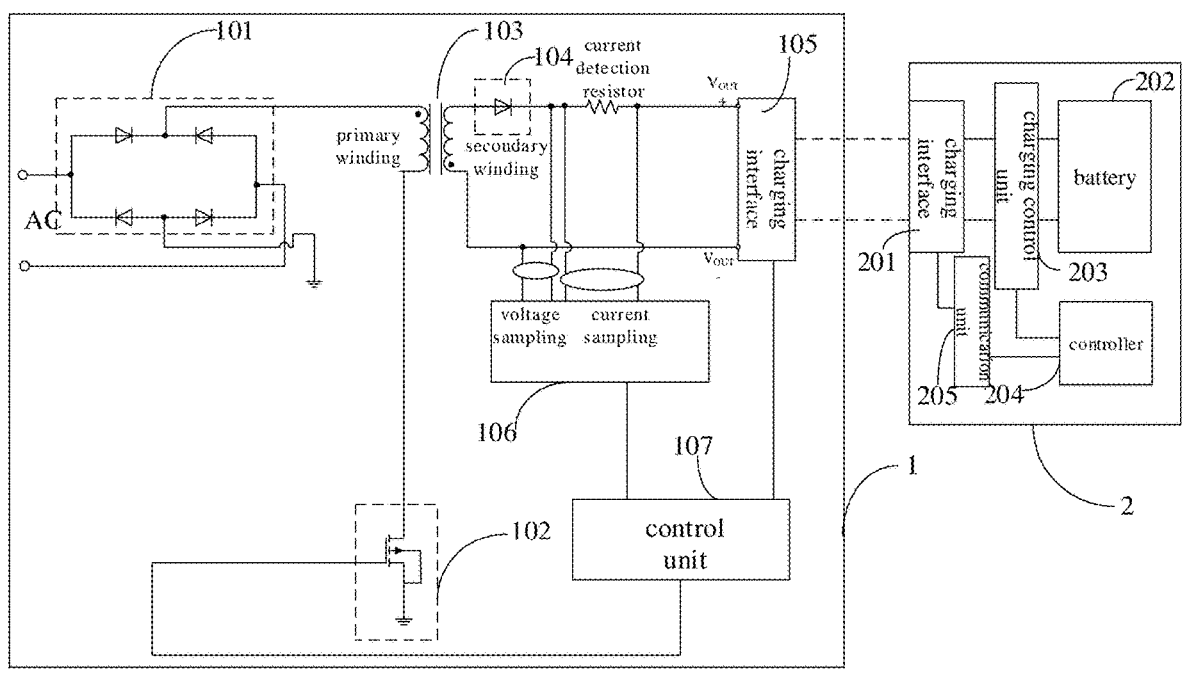
FIG. 14 is a schematic diagram of a device according to another embodiment of the present disclosure.

As illustrated in FIG. 14, the device 2 further includes a communication unit 205. The communication unit 205 is configured to establish a bidirectional communication between the controller 204 and the control unit 107 via the second charging interface 201 and the first charging interface 105. In other words, the device 2 and the power adapter 1 can perform the bidirectional communication via the data wire in the USB interface. The device 2 supports the second charging mode and the first charging mode. The charging current of the first charging mode is greater than that of the second charging mode. The communication unit 205 is configured to perform the bidirectional communication with the control unit 107 such that the power adapter 1 determines to charge the device 2 in the first charging mode, and the control unit 107 controls the power adapter 1 to output according to the charging current corresponding to the first charging mode, for charging the battery 202 in the device 2.

In embodiments of the present disclosure, the power adapter 1 does not increase the output current blindly for the quick charging, but needs to perform the bidirectional communication with the device 2 to negotiate whether to adopt the first charging mode. In contrast to the related art, the safety of the quick charging process can be improved.

As an embodiment, the controller is configured to receive the first instruction sent by the control unit via the communication unit. The first instruction is configured to query the device whether to enable the first charging mode. The controller is configured to send a reply instruction to the first instruction to the control unit via the communication unit. The reply instruction to the first instruction is configured to indicate that the device agrees to enable the first charging mode.

As an embodiment, before the controller receives the first instruction sent by the control unit via the communication unit, the battery in the device is charged by the power adapter in the second charging mode. When the control unit determines that a charging duration of the second charging mode is greater than a predetermined threshold, the control unit sends the first instruction to the communication unit in the device, and the controller receives the first instruction sent by the control unit via the communication unit.

As an embodiment, before the power adapter outputs according to the charging current corresponding to the first charging mode for charging the battery in the device, the controller is configured to perform the bidirectional communication with the control unit via the communication unit, such that the power adapter determines the charging voltage corresponding to the first charging mode.

As an embodiment, the controller is configured to receive a second instruction sent by the control unit. The second instruction is configured to query whether a current output voltage of the power adapter is suitable for being used as the charging voltage corresponding to the first charging mode. The controller is configured to send a reply instruction to the second instruction to the control unit. The reply instruction to the second instruction is configured to indicate that the current output voltage of the power adapter is suitable, high or low.

As an embodiment, the controller is configured to perform the bidirectional communication with the control unit, such that the power adapter determines the charging current corresponding to the first charging mode.

The controller is configured to receive a third instruction sent by the control unit, in which the third instruction is configured to query a maximum charging current currently supported by the device. The controller is configured to send a reply instruction to the third instruction to the control unit, in which the reply instruction to the third instruction is configured to indicate the maximum charging current currently supported by the device, such that the power adapter determines the charging current corresponding to the first charging mode according to the maximum charging current.

As an embodiment, during a process that the power adapter charges the device in the first charging mode, the controller is configured to perform the bidirectional communication with the control unit, such that the power adapter continuously adjusts a charging current outputted to the battery.

The controller is configured to receive a fourth instruction sent by the control unit, in which the fourth instruction is configured to query a current voltage of the battery in the device. The controller is configured to send a reply instruction to the fourth instruction to the control unit, in which the reply instruction to the fourth instruction is configured to indicate the current voltage of the battery in the device, such that the power adapter continuously adjusts the charging current outputted to the battery according to the current voltage of the battery.

As an embodiment, during the process that the power adapter charges the device in the first charging mode, the controller is configured to perform the bidirectional communication with the control unit via a communication unit, such that the power adapter determines whether the first charging interface and the second charging interface are in poor contact.

The controller receives a fourth instruction sent by the control unit. The fourth instruction is configured to query a current voltage of the battery in the device. The controller sends a reply instruction to the fourth instruction to the control unit, in which the fourth instruction to the fourth instruction is configured to indicate the current voltage of the battery in the device, such that the control unit determines whether the first charging interface and the second charging interface are in poor contact according to an output voltage of the power adapter and the current voltage of the battery.

As an embodiment, the controller is configured to receive a fifth instruction sent by the control unit. The fifth instruction is configured to indicate that the first charging interface and the second charging interface are in poor contact.

Figure 6:
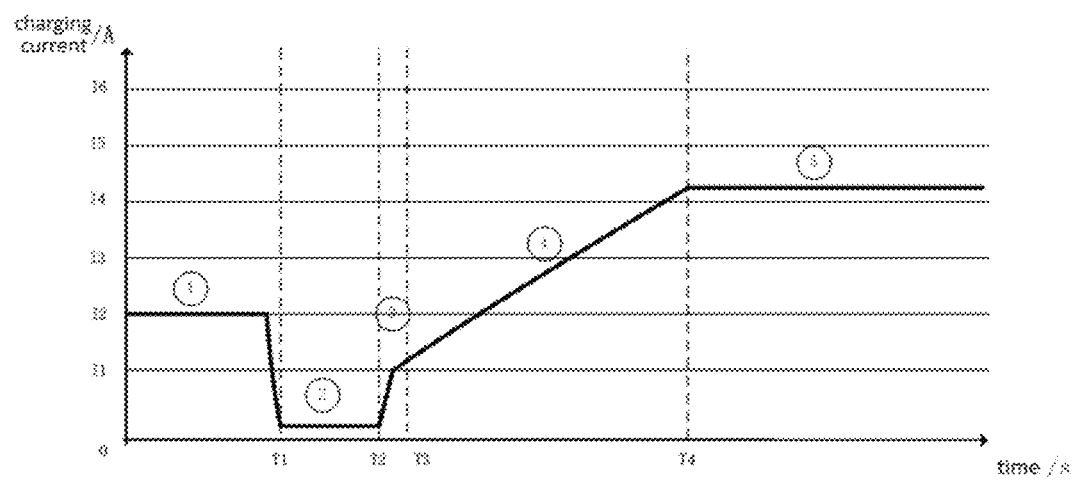
FIG. 6 is a schematic diagram illustrating a quick charging process according to an embodiment of the present disclosure.

In order to initiate and adopt the first charging mode, a quick charging communication procedure may be performed between the power adapter and the device, for example, quick charging of battery can be achieved through one or more handshakes. Referring to FIG. 6, the quick charging communication procedure according to embodiments of the present disclosure and respective stages in the quick charging process will be described in detail. It should be understood that, communication actions or operations illustrated in FIG. 6 are merely exemplary. Other operations or various modifications of respective operations in FIG. 6 can be implemented in embodiments of the present disclosure. In addition, respective stages in FIG. 6 may be executed in an order different from that illustrated in FIG. 6, and it is unnecessary to execute all the operations illustrated in FIG. 6. It should be noted that, a curve in FIG. 6 represents a variation trend of a peak value or a mean value of the charging current, rather than a curve of actual charging current.

As illustrated in FIG. 6, the quick charging process may include the following five stages.

Stage 1:

After being coupled to a power supply providing device, the device may detect a type of the power supply providing device via the data wire D+ and D−. When detecting that the power supply providing device is a power adapter, the device may absorb current greater than a predetermined current threshold I2, such as 1A. When the power adapter detects that current outputted by the power adapter is greater than or equal to 12 within a predetermined time period (such as a continuous time period T1), the power adapter determines that the device has completed the recognition of the type of the power supply providing device. The power adapter initiates a handshake communication between the power adapter and the device, and sends an instruction 1 (corresponding to the above-mentioned first instruction) to query the device whether to enable the first charging mode (or flash charging).

When receiving from the device a reply instruction indicating that the device disagrees to enable the first charging mode, the power adapter detects the output current of the power adapter again. When the output current of the power adapter is still greater than or equal to I2 within a predetermined continuous time period (such as a continuous time period T1), the power adapter initiates a request again to query the device whether to start the first charging model. The above actions in stage 1 are repeated, until the device replies that it agrees to enable the first charging mode or the output current of the power adapter is no longer greater than or equal to I2.

After the device agrees to enable the first charging mode, the quick charging process is initiated, and the quick charging communication procedure proceeds to stage 2.

Stage 2:

For the voltage with the steamed-bun shaped waveform outputted by the power adapter, there may be several levels. The power adapter sends an instruction 2 (corresponding to the above-mentioned second instruction) to the device to query the device whether the output voltage of the power adapter matches with the current voltage of the battery (or whether the output voltage of the power adapter is suitable, i.e., suitable for the charging voltage in the first charging mode), i.e., whether the output voltage of the power adapter meets the charging requirement.

The device replies that the output voltage of the power adapter is higher, lower or suitable. When the power adapter receives a feedback indicating that the output voltage of the power adapter is lower or higher from the device, the control unit adjusts the output voltage of the power adapter by one level by adjusting the duty ratio of the PWM signal, and sends the instruction 2 to the device again to query the device whether the output voltage of the power adapter matches.

The above actions in stage 2 are repeated, until the device replies to the power adapter that the output voltage of the power adapter is at a matching level. And then the quick charging communication procedure proceeds to stage 3.

Stage 3:

After the power adapter receives the feedback indicating that the output voltage of the power adapter matches from the device, the power adapter sends an instruction 3 (corresponding to the above-mentioned third instruction) to the device to query the maximum charging current currently supported by the device. The device returns to the power adapter the maximum charging current currently supported by itself, and then the quick charging communication procedure goes into stage 4.

Stage 4:

After receiving a feedback indicating the maximum charging current currently supported by the device from the device, the power adapter may set an output current reference value. The control unit 107 adjusts the duty ratio of the PWM signal according to the output current reference value, such that the output current of the power adapter meets the charging current requirement of the device, and the quick charging communication procedure proceeds to constant current stage. The constant current stage means that the peak value or mean value of the output current of the power adapter basically remains unchanged (which means that the variation amplitude of the peak value or mean value of the output current is very small, for example within a range of 5% of the peak value or mean value of the output current), namely, the peak value of the current with the third pulsating waveform keeps constant in each period.

Stage 5:

When the quick charging communication procedure proceeds to the constant current stage, the power adapter sends an instruction 4 (corresponding to the above-mentioned fourth instruction) at intervals to query the current voltage of battery in the device. The device may feedback to the power adapter the current voltage of the battery, and the power adapter may determine according to the feedback of the current voltage of the battery whether the poor USB contact (i.e., the poor contact between the first charging interface and the second charging interface) is poor and whether it is necessary to decrease the charging current value of the device. When the power adapter determines that the USB is in poor contact, the power adapter sends an instruction 5 (corresponding to the above-mentioned fifth instruction), and then the power adapter is reset, such that the quick charging communication procedure proceeds to stage 1 again.

In some embodiments of the present disclosure, in stage 1, when the device replies to the instruction 1, data corresponding to the instruction 1 may carry data (or information) on the path impedance of the device. The data on the path impedance of the device may be used in stage 5 to determine whether the USB is in poor contact.

In some embodiments of the present disclosure, in stage 2, the time period from when the device agrees to enable the first charging mode to when the power adapter adjusts the voltage to a suitable value may be limited in a certain range. If the time period exceeds a predetermined range, the device may determine that there is an exception request, thus a quick reset is performed.

In some embodiments of the present disclosure, in stage 2, the device may give a feedback indicating that the output voltage of the power adapter is suitable/matches to the power adapter when the output voltage of the power adapter is adjusted to a value higher than the current voltage of the battery by $\Delta V$ ($\Delta V$ is about 200-500 mV). When the device gives a feedback indicating that the output voltage of the power adapter is not suitable (higher or lower) to the power adapter, the control unit 107 adjusts the duty ratio of the PWM signal according to the voltage sampling value, so as to adjust the output voltage of the power adapter.

In some embodiments of the present disclosure, in stage 4, the adjusting speed of the output current value of the power adapter may be controlled to be in a certain range, thus avoiding an abnormal interruption of the quick charging due to a too fast adjusting speed.

In some embodiments of the present disclosure, in stage 5, the variation amplitude of the output current value of the power adapter may be controlled to be within 5%, i.e., stage 5 may be regarded as the constant current stage.

In some embodiments of the present disclosure, in stage 5, the power adapter monitors the impedance of a charging loop in real time, i.e., the power adapter monitors the impedance of the whole charging loop by measuring the output voltage of the power adapter, the charging current and the read-out voltage of the battery in the device. When the impedance of the charging loop>the path impedance of the device+the impedance of the quick charging data wire, it may be considered that the USB is in poor contact, and thus a quick charging reset is performed.

In some embodiments of the present disclosure, after the first charging mode is started, a time interval of communications between the power adapter and the device may be controlled to be in a certain range, such that the quick charging reset can be avoided.

In some embodiments of the present disclosure, the termination of the first charging mode (or the quick charging process) may be a recoverable termination or an unrecoverable termination.

For example, when the device detects that the battery is fully charged or the USB is in poor contact, the quick charging is stopped and reset, and the quick charging communication procedure proceeds to stage 1. When the device disagrees to enable the first charging mode, the quick charging communication procedure would not proceed to stage 2, thus the termination of the quick charging process may be considered as an unrecoverable termination.

For another example, when an exception occurs in the communication between the device and the power adapter, the quick charging is stopped and reset, and the quick charging communication procedure proceeds to stage 1. After requirements for stage 1 are met, the device agrees to enable the first charging mode to restore the quick charging process, and this termination of the quick charging process may be considered as a recoverable termination.

For another example, when the device detects an exception occurring in the battery, the quick charging is stopped and reset, and the quick charging communication procedure proceeds to stage 1. After the quick charging communication procedure proceeds to stage 1, the device disagrees to enable the first charging mode. Till the battery returns to normal and the requirements for stage 1 are met, the device agrees to enable the quick charging to recover the quick charging process. This termination of quick charging process may be considered as a recoverable termination.

It should be noted that, communication actions or operations illustrated in FIG. 6 are merely exemplary. For example, in stage 1, after the device is coupled to the power adapter, the handshake communication between the device and the power adapter may be initiated by the device. In other words, the device sends an instruction 1 to query the power adapter whether to enable the first charging mode (or flash charging). When receiving a reply instruction indicating that the power adapter agrees to enable the first charging mode from the power adapter, the device starts the quick charging process.

It should be noted that, communication actions or operations illustrated in FIG. 6 are merely exemplary. For example, after stage 5, there can be a constant voltage charging stage. In other words, in stage 5, the device may feedback the current voltage of the battery in the device to the power adapter. As the voltage of the battery increases continuously, the charging proceeds to the constant voltage charging stage when the current voltage of the battery reaches a constant voltage charging voltage threshold. The control unit 107 adjusts the duty ratio of the PWM signal according to the voltage reference value (i.e., the constant voltage charging voltage threshold), such that the output voltage of the power adapter meets the charging voltage requirement of the device, i.e., the output voltage of the power adapter basically changes at a constant rate. During the constant voltage charging stage, the charging current decreases gradually. When the current drops to a certain threshold, the charging is stopped and it is identified that the battery has been fully charged. The constant voltage charging refers to that the peak voltage with the third pulsating waveform basically keeps constant.

It should be noted that, in embodiments of the present disclosure, acquiring output voltage of the power adapter means that the peak value or mean value of voltage with the third pulsating waveform is acquired. Acquiring output current of the power adapter means that the peak value or mean value of current with the third pulsating waveform is acquired.

Figure 7A:
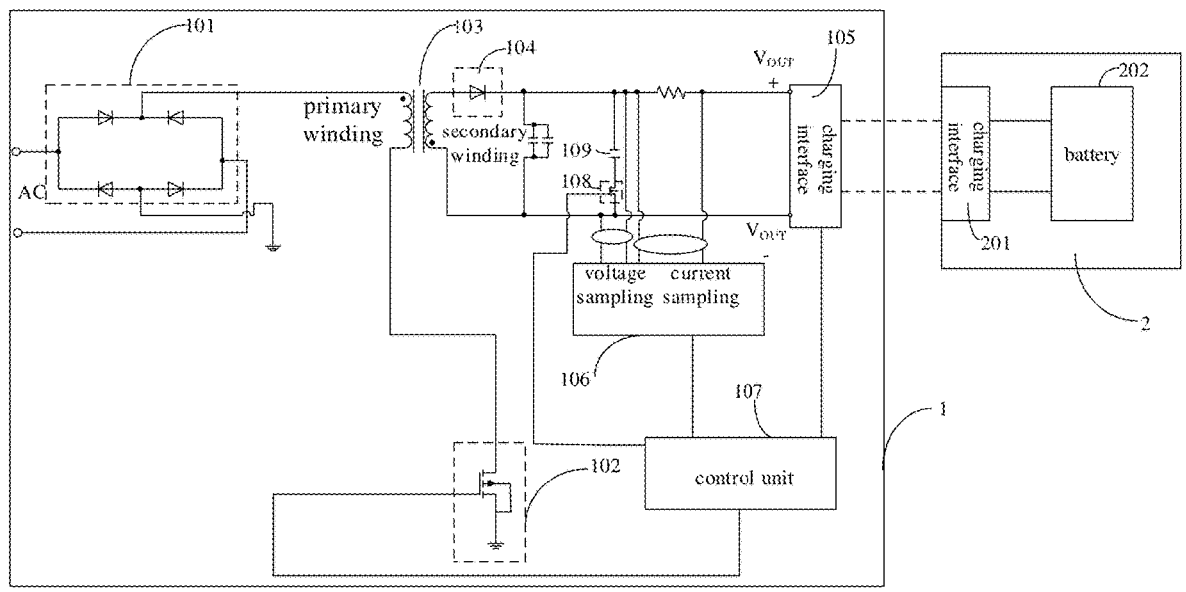
FIG. 7A is a schematic diagram of a charging system according to an embodiment of the present disclosure.
Figure 7B:
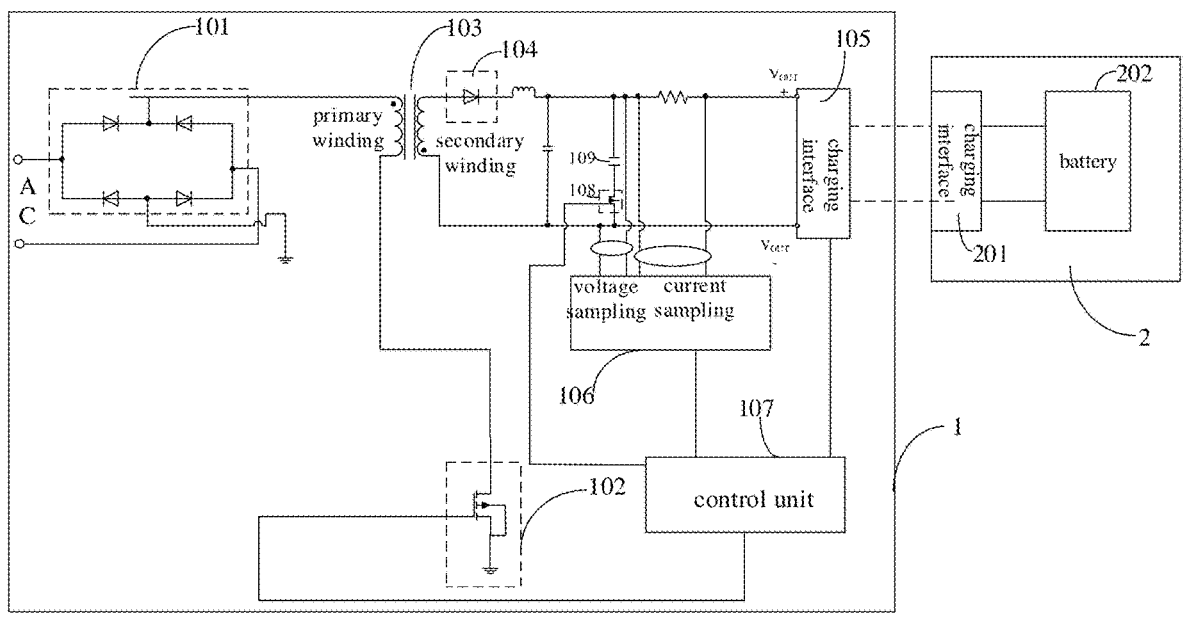
FIG. 7B is a schematic diagram of a power adapter with a LC filter circuit according to an embodiment of the present disclosure.

In an embodiment of the present disclosure, as illustrated in FIG. 7A, the power adapter 1 further includes a controllable switch 108 and a filtering unit 109 in series. The controllable switch 108 and the filtering unit 109 in series are coupled to the first output end of the second rectification unit 104. The control unit 107 is further configured to control the controllable switch 108 to switch on when determining the charging mode as the second charging mode, and to control the controllable switch 108 to switch off when determining the charging mode as the first charging mode. The output end of the second rectification unit 104 is further coupled to one or more groups of small capacitors in parallel, which can not only realize a noise reduction, but also reduce the occurrence of surge phenomenon. The output end of the second rectification unit 104 is further coupled to an LC filtering circuit or $\pi$ type filtering circuit, so as to filter out pulsating interference. As illustrated in FIG. 7B, the output end of the second rectification unit 104 is coupled to an LC filtering circuit. It should be noted that, all capacitors in the LC filtering circuit or the $\pi$ type filtering circuit are small capacitors, which occupy small space.

The filtering unit 109 includes a filtering capacitor, which supports a standard charging of 5V corresponding to the second charging mode. The controllable switch 108 may consist of a semiconductor switch element such as a MOS transistor. When the power adapter charges the battery in the device in the second charging mode (or called as standard charging), the control unit 107 controls the controllable switch 108 to switch on so as to incorporate the filtering unit 109 into the circuit, such that a filtering can be performed on the output of the second rectification unit. In this way, the direct charging technology is compatible, i.e., the direct current is applied to the battery in the device so as to realize direct current charging of the battery. For example, in general, the filtering unit includes an electrolytic capacitor and a common capacitor such as a small capacitor supporting standard charging of 5V (for example, a solid-state capacitor) in parallel. Since the electrolytic capacitor occupies a bigger volume, in order to reduce the size of the power adapter, the electrolytic capacitor may be removed from the power adapter and only one capacitor with low capacitance is left. When the second charging mode is adopted, a branch where the small capacitor is located is switched on, and the current is filtered to realize a stable output with low power for performing a direct current charging on the battery. When the first charging mode is adopted, a branch where the small capacitor is located is switched off, and the output of the second rectification unit 104 directly apply the voltage/current with pulsating waveform without filtering to the battery, so as to realize a quick charging of the battery.

According to an embodiment of the present disclosure, the control unit 107 is further configured to obtain the charging current and/or the charging voltage corresponding to the first charging mode according to the status information of the device and to adjust the duty ratio of the control signal such as the PWM signal according to the charging current and/or the charging voltage corresponding to the first charging mode, when determining the charging mode as the first charging mode. In other words, when determining the current charging mode as the first charging mode, the control unit 107 obtains the charging current and/or the charging voltage corresponding to the first charging mode according to the obtained status information of the device such as the voltage, the electric quantity and the temperature of the battery, running parameters of the device and power consumption information of applications running on the device, and adjusts the duty ratio of the control signal according to the obtained charging current and/or the charging voltage, such that the output of the power adapter meets the charging requirement, thus realizing the quick charging of the battery.

The status information of the device may include the temperature of the device. When the temperature of the battery is greater than a first predetermined temperature threshold, or the temperature of the battery is less than a second predetermined temperature threshold, if the current charging mode is the first charging mode, the first charging mode is switched to the second charging mode. The first predetermined temperature threshold is greater than the second predetermined temperature threshold. In other words, when the temperature of the battery is too low (for example, corresponding to less than the second predetermined temperature threshold) or too high (for example, corresponding to greater than the first predetermined temperature threshold), it is unsuitable to perform the quick charging, such that it needs to switch from the first charging mode to the second charging mode. In embodiments of the present disclosure, the first predetermined temperature threshold and the second predetermined temperature threshold can be set, or can be written into the storage of the control unit (such as the MCU of the power adapter) according to actual situations.

In an embodiment of the present disclosure, the control unit 107 is further configured to control the switch unit 102 to switch off when the temperature of the battery is greater than a predetermined high-temperature protection threshold. Namely, when the temperature of the battery exceeds the high-temperature protection threshold, the control unit 107 needs to apply a high-temperature protection strategy, such that switch unit 102 is off, such that the power adapter stops charging the battery, thus realizing the high-temperature protection of the battery and improving the safety of charging. The high-temperature protection threshold may be different from or the same to the first temperature threshold. In an embodiment, the high-temperature protection threshold is greater than the first temperature threshold.

In another embodiment of the present disclosure, the controller is further configured to obtain the temperature of the battery, and to control the charging control switch to switch off (i.e., the charging control switch can be switched off at the device side) when the temperature of the battery is greater than the predetermined high-temperature protection threshold, so as to stop the charging process of the battery and to ensure the safety of charging.

Moreover, in an embodiment of the present disclosure, the control unit is further configured to obtain a temperature of the first charging interface, and to control the switch unit to switch off when the temperature of the first charging interface is greater than a predetermined protection temperature. In other words, when the temperature of the charging interface exceeds a certain temperature, the control unit 107 needs to apply the high-temperature protection strategy to control the switch unit 102 to switch off, such that the power adapter stops charging the battery, thus realizing the high-temperature protection of the battery and improving the safety of charging.

Certainly, in another embodiment of the present disclosure, the controller obtains the temperature of the first charging interface by performing the bidirectional communication with the control unit. When the temperature of the first charging interface is greater than the predetermined protection temperature, the controller controls the charging control switch (referring to FIGS. 13 and 14) to switch off, i.e., switches off the charging control switch at the device side, so as to stop the charging process of the battery, thus ensuring the safety of charging.

Figure 8:
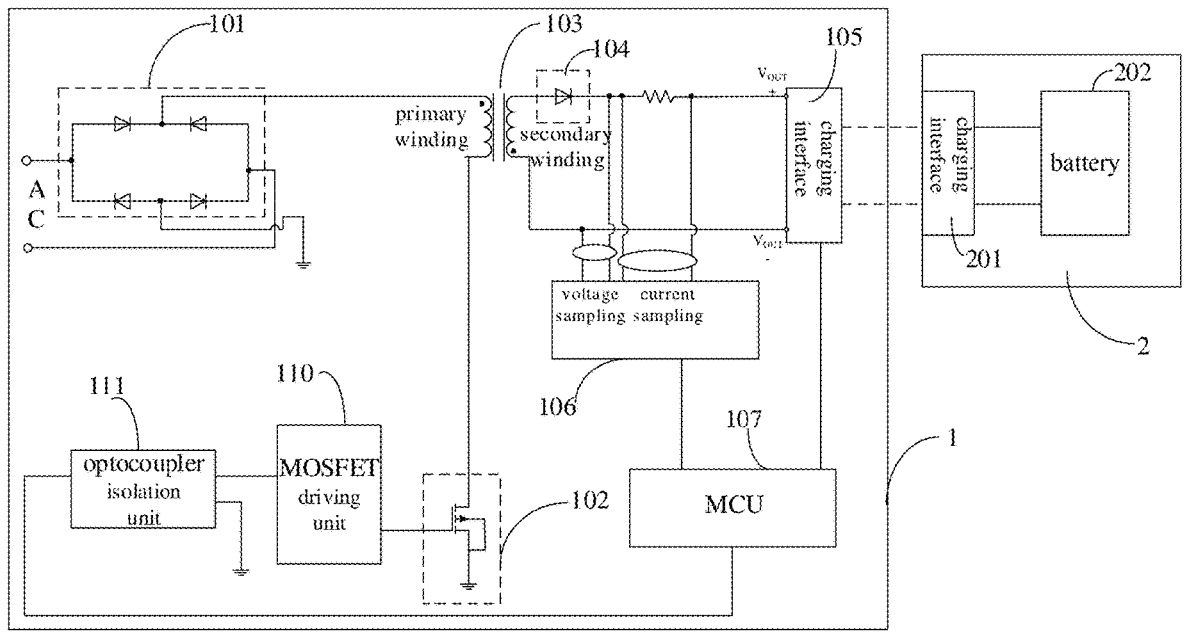
FIG. 8 is a schematic diagram of a charging system according to another embodiment of the present disclosure.

In detail, in an embodiment of the present disclosure, as illustrated in FIG. 8, the power adapter 1 further includes a driving unit 110 such as a MOSFET driver. The driving unit 110 is coupled between the switch unit 102 and the control unit 107. The driving unit 110 is configured to drive the switch unit 102 to switch on or off according to the control signal. Certainly, it should be noted, in other embodiments of the present disclosure, the driving unit 110 may also be integrated in the control unit 107.

Further, as illustrated in FIG. 8, the power adapter 1 further includes an isolation unit 111. The isolation unit 111 is coupled between the driving unit 110 and the control unit 107, to prevent high voltages from affecting the control unit 107 at the secondary side of the transformer 103. The isolation unit 111 may be implemented in an optocoupler isolation manner, or in other isolation manners. By setting the isolation unit 111, the control unit 107 may be disposed at the secondary side of the power adapter 1 (or the secondary winding side of the transformer 103), such that it is convenient to communicate with the device 2, and the space design of the power adapter 1 becomes easier and simpler.

Certainly, it should be understood that, in other embodiments of the present disclosure, both the control unit 107 and the driving unit 110 can be disposed as the primary side, in this way, the isolation unit 111 can be disposed between the control unit 107 and the sampling unit 106, so as to prevent high voltages from affecting the control unit 107 at the secondary side of the transformer 103.

Further, it should be noted that, in embodiments of the present disclosure, when the control unit 107 is disposed at the secondary side, an isolation unit 111 is required, and the isolation unit 111 may be integrated in the control unit 107. In other words, when the signal is transmitted from the primary side to the secondary side or from the secondary side to the primary side, an isolation unit is required to prevent high voltages from affecting the control unit 107 at the secondary side of the transformer 103.

Figure 9:
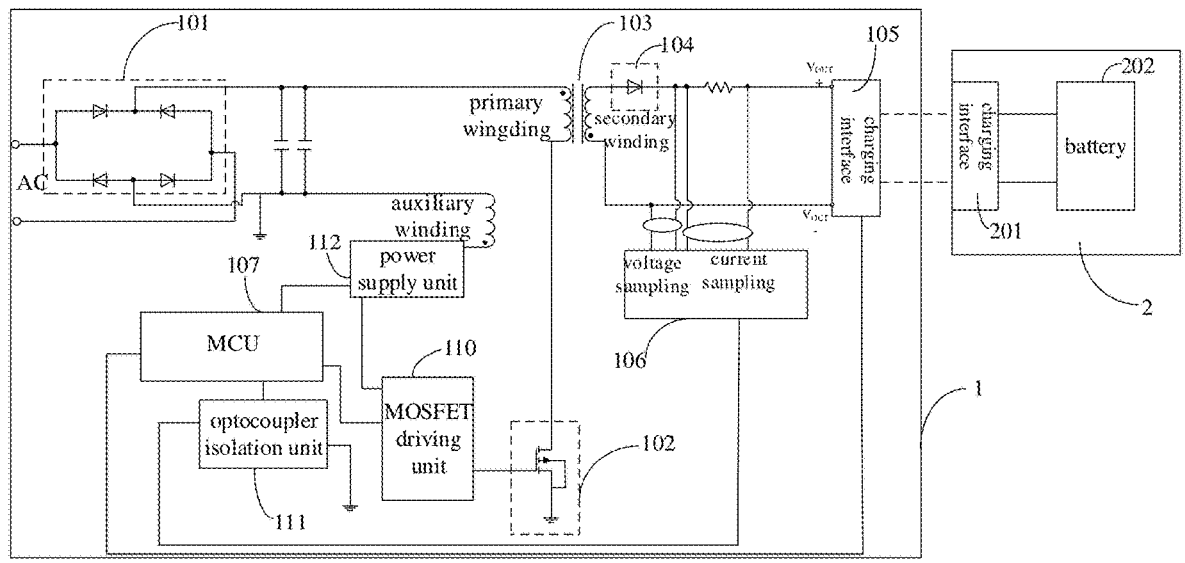
FIG. 9 is a schematic diagram of a charging system according to yet another embodiment of the present disclosure.

In an embodiment of the present disclosure, as illustrated in FIG. 9, the power adapter 1 further includes an auxiliary winding and a power supply unit 112. The auxiliary winding generates a voltage with a fourth pulsating waveform according to the modulated voltage with the first pulsating waveform. The power supply unit 112 is coupled to the auxiliary winding.

The power supply unit 112 (for example, including a filtering voltage regulator module, a voltage converting module and the like) is configured to convert the voltage with the fourth pulsating waveform and output a direct current, and to supply power to the driving unit 110 and/or the control unit 107 respectively. The power supply unit 112 may consist of a small filtering capacitor, a voltage regulator chip or other elements. The power supply unit 112 may process and convert the voltage with the fourth pulsating waveform and outputs a direct current with a low voltage such as 3.3V, 5V or the like.

In other words, the power supply of the driving unit 110 can be obtained by performing a voltage conversation on the voltage with the fourth pulsating waveform by the power supply unit 112. When the control unit 107 is disposed at the primary side, the power supply of the control unit 107 can also be obtained by performing a voltage conversation on the voltage with the fourth pulsating waveform by the power supply unit 112. As illustrated in FIG. 9, when the control unit 107 is disposed at the primary side, the power supply unit 112 provides two lines of direct current outputs, so as to supply power to the driving unit 110 and the control unit 107 respectively. An optocoupler isolation unit 111 is arranged between the control unit 107 and the sampling unit 106 to prevent high voltages from affecting the control unit 107 at the secondary side of the transformer 103.

When the control unit 107 is disposed at the primary side and integrated with the driving unit 110, the power supply unit 112 supplies power to the control unit 107 separately. When the control unit 107 is disposed at the secondary side and the driving unit 110 is disposed at the primary side, the power supply unit 112 supplies power to the driving unit 110 separately. The power supply to the control unit 107 is realized by the secondary side, for example, a power supply unit converts the voltage with the third pulsating waveform outputted by the second rectification unit 104 to a direct current to supply power to the control unit 107.

Moreover, in embodiments of the present disclosure, several small capacitors are coupled in parallel to the output end of first rectification unit 101 for filtering. Or the output end of the first rectification unit 110 is coupled to an LC filtering circuit.

Figure 10:
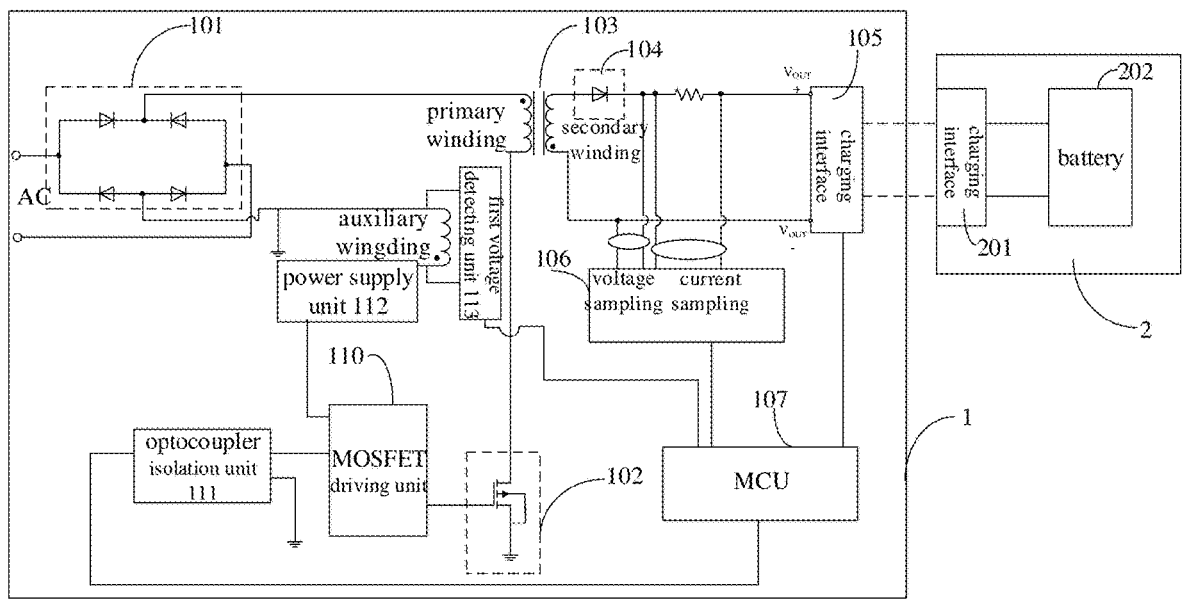
FIG. 10 is a schematic diagram of a charging system according to still another embodiment of the present disclosure.

In another embodiment of the present disclosure, as illustrated in FIG. 10, the power adapter 1 further includes a first voltage detecting unit 113. The first voltage detecting unit 113 is coupled to the auxiliary winding and the control unit 107 respectively. The first voltage detecting unit 113 is configured to detect the voltage with the fourth ripple waveform to generate a voltage detecting value. The control unit 107 is further configured to adjust the duty ratio of the control signal according to the voltage detecting value.

In other words, the control unit 107 may reflect the voltage outputted by the second rectification unit 104 according to the voltage outputted by the secondary winding and detected by the first voltage detecting unit 113, and then adjusts the duty ratio of the control signal according to the voltage detecting value, such that the output of the second rectification unit 104 meets the charging requirement of the battery.

Figure 11:
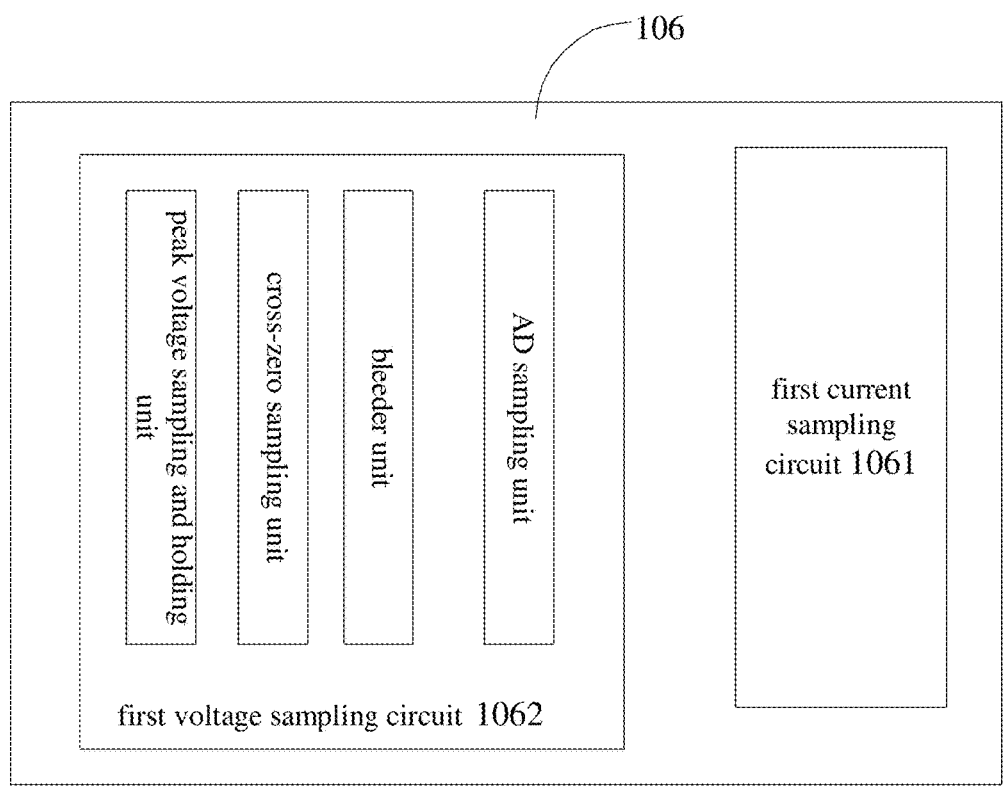
FIG. 11 is a block diagram of a sampling unit according to an embodiment of the present disclosure.

In detail, in an embodiment of the present disclosure, as illustrated in FIG. 11, the sampling unit 106 includes a first current sampling circuit 1061 and a first voltage sampling circuit 1062. The first current sampling circuit 1061 is configured to sample the current outputted by the second rectification unit 104 so as to obtain the current sampling value. The first voltage sampling circuit 1062 is configured to sample the voltage outputted by the second rectification unit 104 so as to obtain the voltage sampling value.

In an embodiment of the present disclosure, the first current sampling circuit 1061 can sample the current outputted by the second rectification unit 104 by sampling a voltage on a resistor (current detection resistor) coupled to the first output end of the second rectification unit 104. The first voltage sampling circuit 1062 can sample the voltage outputted by the second rectification unit 104 by sampling a voltage across the first output end and the second output end of the second rectification unit 104.

Moreover, in an embodiment of the present disclosure, as illustrated in FIG. 11, the first voltage sampling circuit 1062 includes a peak voltage sampling and holding unit, a cross-zero sampling unit, a bleeder unit and an AD sampling unit. The peak voltage sampling and holding unit is configured to sample and hold a peak voltage of the voltage with the third pulsating waveform. The cross-zero sampling unit is configured to sample a zero crossing point of the voltage with the third pulsating waveform. The bleeder unit is configured to discharge the peak voltage sampling and holding unit at the zero crossing point. The AD sampling unit is configured to sample the peak voltage in the peak voltage sampling and holding unit so as to obtain the voltage sampling value.

By providing with the peak voltage sampling and holding unit, the cross-zero sampling unit, the bleeder unit and the AD sampling unit in the first voltage sampling circuit 1062, the voltage outputted by the second rectification unit 104 may be sampled accurately, and it can be guaranteed that the voltage sampling value keeps synchronous with the voltage with the first ripple waveform, i.e., the phase and variation trend of magnitude of the voltage sampling value are consistent with those of the voltage with the first ripple waveform respectively.

Figure 12:
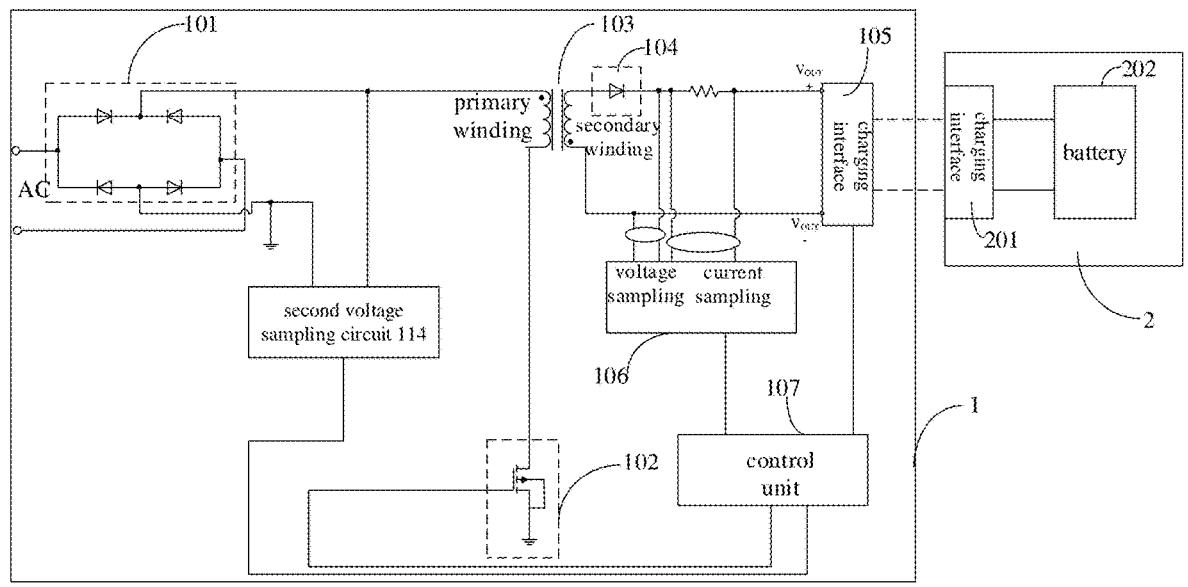
FIG. 12 is a schematic diagram of a charging system according to still yet another embodiment of the present disclosure.

According to an embodiment of the present disclosure, as illustrated in FIG. 12, the power adapter 1 further includes a second voltage sampling circuit 114. The second voltage sampling circuit 114 is configured to sample the voltage with the first pulsating waveform. The second voltage sampling circuit 114 is coupled to the control unit 107. When the voltage value sampled by the second voltage sampling circuit 114 is greater than a first predetermined voltage value, the control unit 107 controls the switch unit 102 to switch on for a predetermined time period, to drain off the surge voltage, spike voltage in the voltage with the first pulsating waveform.

As illustrated in FIG. 12, the second voltage sampling circuit 114 can be coupled to the first output end and the second output end of the first rectification unit 101, so as to sample the voltage with the first pulsating waveform. The control unit 107 determines the voltage value sampled by the second voltage sampling circuit 114. When the voltage value sampled by the second voltage sampling circuit 114 is greater than the first predetermined voltage value, it indicates that the power adapter 1 is suffering the lightning interference and a surge voltage occurs, and thus it needs to drain off the surge voltage for ensuring the safety and reliability of charging. The control unit 107 controls the switch unit 102 to switch on for a certain time period, to form a bleeder path, such that the surge voltage caused by lightning can be drained off, thus avoiding the interference of the lightning when the power adapter charges the device, and effectively improving the safety and reliability of the charging of the device. The first predetermined voltage value may be determined according to actual situations.

In an embodiment of the present disclosure, during a process that the power adapter 1 charges the battery 202 of the device 2, the control unit 107 is further configured to control the switch unit 102 to switch off when a voltage value sampled by the sampling unit 106 is greater than a second predetermined voltage value. Namely, the control unit 107 further determines the magnitude of the voltage value sampled by the sampling unit 106. When the voltage value sampled by the sampling unit 106 is greater than the second predetermined voltage value, it indicates that the voltage outputted by the power adapter 1 is too high. At this time, the control unit 107 controls the power adapter 1 to stop charging the battery 202 of the device 2 by controlling the switch unit 102 to switch off. In other words, the control unit 107 can realize the over-voltage protection of the power adapter 1 by controlling the switch unit 102 to switch off, thus ensuring the safety of charging.

Certainly, in an embodiment of the present disclosure, the controller 204 obtains the voltage value sampled by the sampling unit 106 (referring to FIGS. 13 and 14) by performing a bidirectional communication with the control unit 107, and controls the charging control switch 203 to switch off when the voltage value sampled by the sampling unit 106 is greater than the second predetermined voltage value. Namely, the charging control switch 203 is controlled to switch off at the side of the device 2, so as to stop the charging process of battery 202, such that the safety of charging can be ensured.

Further, the control unit 107 is further configured to control the switch unit 102 to switch off when the current value sampled by the sampling unit 106 is greater than a predetermined current value. In other words, the control unit 107 further determines the magnitude of the current value sampled by the sampling unit 106. When the current value sampled by the sampling unit 106 is greater than the predetermined current value, it indicates that the current outputted by the power adapter 1 is too high. At this time, the control unit 107 controls the power adapter 1 to stop charging the device by controlling the switch unit 102 to switch off. In other words, the control unit 107 realizes the over-current protection of the power adapter 1 by controlling the switch unit 102 to switch off, thus ensuring the safety of charging.

Similarly, the controller 204 obtains the current value sampled by the sampling unit 106 (referring to FIGS. 13 and 14) by performing the bidirectional communication with the control unit 107, and controls the charging control switch 203 to switch off when the current value sampled by the sampling unit 106 is greater than the predetermined current value. In other words, the charging control switch 203 is controlled to be switched off at the side of the device 2, so as to stop the charging process of the battery 202, thus ensuring the safety of charging.

The second predetermined voltage value and the predetermined current value may be set or written into storage of the control unit (for example, the control unit 107 of the power adaptor 1, such as the microcontroller unit (MCU)) according to actual situations.

In embodiments of the present disclosure, the device may be a mobile device, such as a mobile phone, a mobile power supply such as a power bank, a multimedia player, a notebook PC, a wearable device or the like.

With the charging system device according to embodiments of the present disclosure, the power adapter is controlled to output the voltage with the third pulsating waveform, and the voltage with the third pulsating waveform outputted by the power adapter is directly applied to the battery of the device, thus realizing quick charging to the battery directly by the pulsating output voltage/current. In contrast to the conventional constant voltage and constant current, a magnitude of the pulsating output voltage/current changes periodically, such that a lithium precipitation of the lithium battery may be reduced, the service life of the battery may be improved, and a probability and intensity of arc discharge of a contact of a charging interface may be reduced, the service life of the charging interfaces may be prolonged, and it is beneficial to reduce polarization effect of the battery, improve a charging speed, and reduce heat of the battery, thus ensuring the reliability and safety of the device during the charging. Moreover, since the power adapter outputs the voltage with the pulsating waveform, it is unnecessary to provide an electrolytic capacitor in the power adapter, which can not only realize simplification and miniaturization of the power adapter, but can also decrease cost greatly. Furthermore, during the process of performing the pulsating charging on the battery of the device through the power adaptor, the length of the valley of the outputted voltage with the third pulsating waveform is decreased by controlling the duty ratio of the control signal through the control unit, such that a voltage difference between a voltage peak and a voltage valley is reduced, thereby decreasing a fluctuation value of the voltage of the battery when the battery is charged via the pulsating charging. Therefore, it is contributed to sample the peak value of the voltage of the battery through the battery voltage sampling unit. The power adaptor may adjust the charging state in real time according to the peak value of the voltage of the battery, thereby ensuring the safety and the reliability of the charging system.

Embodiments of the present disclosure further provide a power adapter. The power adapter includes a first rectification unit, a switch unit, a transformer, a second rectification unit, a first charging interface and a control unit. The first rectification unit is configured to rectify an input alternating current and output a voltage with a first pulsating waveform. The switch unit is configured to modulate the voltage with the first pulsating waveform according to a control signal. The transformer is configured to output a voltage with a second pulsating waveform according to the modulated voltage with the first pulsating waveform. The second rectification unit is configured to rectify the voltage with the second pulsating waveform to output a voltage with a third pulsating waveform. The first charging interface is coupled to the second rectification unit, configured to apply the voltage with the third pulsating waveform to a battery in a device via a second charging interface of the device when the first charging interface is coupled to the second charging interface, in which the second charging interface is coupled to the battery. The control unit is coupled to the switch unit, and configured to output the control signal to the switch unit and to adjust a duty ratio of the control signal such that the voltage with the third pulsating waveform meets a charging requirement. During a process that the power adaptor charges the battery by outputting the voltage with the third pulsating waveform to the battery, the control unit is configured to adjust the duty ratio of the control signal to decrease a length of a valley of the voltage with the third pulsating waveform such that a battery voltage sampling unit is configured to sample a peak value of a voltage of the battery.

With the power adapter according to embodiments of the present disclosure, the voltage with the third pulsating waveform is outputted via the first charging interface, and the voltage with the third pulsating waveform is directly applied to the battery of the device via the second charging interface of the device, thus realizing quick charging to the battery directly by the pulsating output voltage/current. In contrast to the conventional constant voltage and constant current, a magnitude of the pulsating output voltage/current changes periodically, such that a lithium precipitation of the lithium battery may be reduced, the service life of the battery may be improved, and a probability and intensity of arc discharge of a contact of a charging interface may be reduced, the service life of the charging interfaces may be prolonged, and it is beneficial to reduce polarization effect of the battery, improve a charging speed, and reduce heat of the battery, thus ensuring the reliability and safety of the device during the charging. Moreover, since the voltage with the pulsating waveform is output, it is unnecessary to provide an electrolytic capacitor, which can not only realize simplification and miniaturization of the power adapter, but can also decrease cost greatly. Furthermore, during the process of performing the pulsating charging on the battery of the device through the power adaptor, the length of the valley of the outputted voltage with the third pulsating waveform is decreased by controlling the duty ratio of the control signal through the control unit, such that a voltage difference between a voltage peak and a voltage valley is reduced, thereby decreasing a fluctuation value of the voltage of the battery when the battery is charged via the pulsating charging. Therefore, it is contributed to sample the peak value of the voltage of the battery through the battery voltage sampling unit. The power adaptor may adjust the charging state in real time according to the peak value of the voltage of the battery, thereby ensuring the safety and reliability of the charging system.

Figure 15:
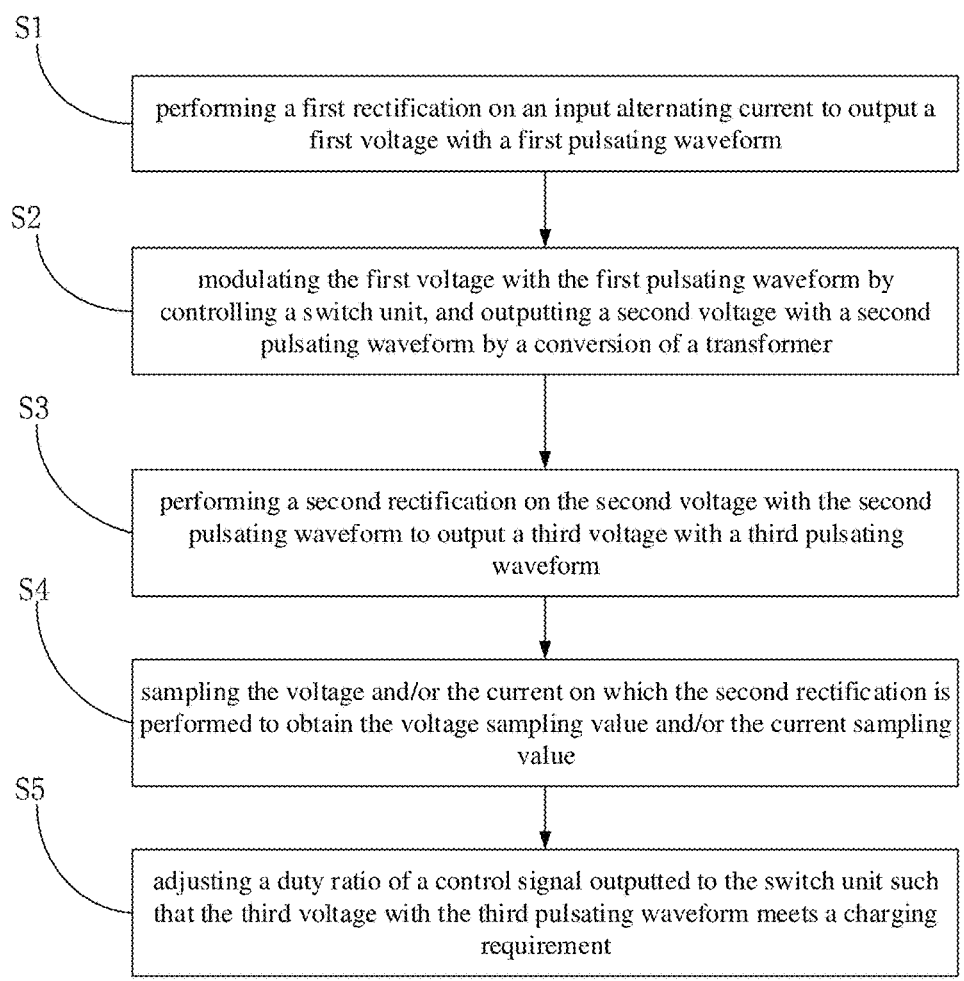
FIG. 15 is a flow chart of a charging method according to embodiments of the present disclosure.

FIG. 15 is a flow chart of a charging method according to embodiments of the present disclosure. As illustrated in FIG. 15, the charging method includes the followings.

At block S1, when a first charging interface of a power adapter is coupled to a second charging interface of a device, a first rectification is performed on alternating current inputted into the power adapter to output a voltage with a first pulsating waveform.

In other words, a first rectification unit in the power adapter rectifies the inputted alternating current (i.e., the mains supply, such as alternating current of 220V, 50 Hz or 60 Hz) and outputs the voltage (for example, 100 Hz or 120 Hz) with the first pulsating waveform, such as a voltage with a steamed-bun shaped waveform.

At block S2, the voltage with the first pulsating waveform is modulated by a switch unit, and then is converted by a transformer to obtain a voltage with a second pulsating waveform.

The switch unit may consist of a MOS transistor. A PWM control is performed on the MOS transistor to perform a chopping modulation on the voltage with the steamed-bun shaped waveform. And then, the modulated voltage the first pulsating waveform is coupled to a secondary side by the transformer, such that the secondary winding outputs the voltage with the second pulsating waveform.

In an embodiment of the present disclosure, a high-frequency transformer is used for conversion, such that the size of the transformer is small, thus realizing miniaturization of the power adapter with high-power.

At block S3, a second rectification is performed on the voltage with the second pulsating waveform to output a voltage with a third pulsating waveform. The voltage with the third pulsating waveform may be applied to a battery of the device via the second charging interface, so as to charge the battery of the device.

In an embodiment of the present disclosure, the second rectification is performed by a second rectification unit on the voltage with the second pulsating waveform. The second rectification unit may consist of diodes or MOS transistors, and can realize a secondary synchronous rectification, such that the third pulsating waveform keeps synchronous with the waveform of the modulated voltage with the first pulsating waveform.

At block S4, a voltage sampling value and/or a current sampling value are obtained by sampling a voltage and/or current on which the second rectification is performed.

At block S5, a duty ratio of a control signal is adjusted for controlling the switch unit according to the voltage sampling value and/or the current sampling value, such that the voltage with the third pulsating waveform meets a charging requirement.

It should be noted that, the voltage with the third pulsating waveform meeting the charging requirement means that, the voltage and current with the third pulsating waveform need to meet the charging voltage and charging current when the battery is charged. In other words, the duty ratio of the control signal (such as a PWM signal) is adjusted according to the voltage and/or current outputted by the power adapter, so as to adjust the output of the power adapter in real time and realize a closed-loop adjusting control, such that the voltage with the third pulsating waveform meets the charging requirement of the device, thus ensuring the stable and safe charging of the battery. In detail, a waveform of a charging voltage outputted to a battery is illustrated in FIG. 3, in which the waveform of the charging voltage is adjusted according to the duty ratio of the PWM signal. A waveform of a charging current outputted to a battery is illustrated in FIG. 4, in which the waveform of the charging current is adjusted according to the duty ratio of the PWM signal.

In an embodiment of the present disclosure, by controlling the switch unit, a PWM chopping modulation can be directly performed on the voltage with the first pulsating waveform i.e., the steamed-bun shaped waveform after a full-bridge rectification, and then a modulated voltage is sent to the high-frequency transformer and is coupled from the primary side to the secondary side via the high-frequency transformer, and then is changed back to the voltage/current with the steamed-bun shaped waveform after a synchronous rectification. The voltage/current with the steamed-bun shaped waveform is directly transmitted to the battery so as to realize quick charging to the battery. The magnitude of the voltage with the steamed-bun shaped waveform may be adjusted according to the duty ratio of the PWM signal, such that the output of the power adapter may meet the charging requirement of the battery. It can be seen from that, electrolytic capacitors at the primary side and the secondary side in the power adapter can be removed, and the battery can be directly charged via the voltage with the steamed-bun shaped waveform, such that a size of the power adapter may be reduced, thus realizing miniaturization of the power adapter, and decreasing cost greatly.

According to an embodiment of the present disclosure, the charging method may include the followings. When a first charging interface of a power adapter is coupled with a second charging interface of the device, a first rectification is performed on an input alternating current to output the voltage with the first pulsating waveform. The voltage with the first pulsating waveform is modulated by controlling the switch unit, and the voltage with the second pulsating waveform is outputted by the conversion of the transformer. The second rectification is performed on the voltage with the second pulsating waveform to output the voltage with the third pulsating waveform, and the voltage with the third pulsating waveform is applied to the battery of the device via the second charging interface. The duty ratio of the control signal outputted to the switch unit is adjusted such that the voltage with the third pulsating waveform meets the charging requirement, and during the process that the power adaptor charges the battery by outputting the voltage with the third pulsating waveform to the battery, a trough duration of the third pulsating waveform is decreased by adjusting the duty ratio of the control signal such that the device is configured to sample the peak value of the voltage of the battery.

In other words, during the power adapter charges the battery by outputting the voltage with the third pulsating waveform, as the battery is charged with pulsating waveforms, it may not guarantee that the peak value of the voltage of the battery is sampled precisely each time by the battery voltage sampling unit. When the battery is charged with the pulsating waveforms, if the charging current is stopped, the charging current does not drop to zero immediately, but is decreased slowly. The shorter the stopped period, the less the change in the charging voltage. Therefore, in embodiments of the present disclosure, the length of the valley of the voltage with the third pulsating waveform is decreased by adjusting the duty ratio of the control signal, thereby reducing a voltage difference between the peak value and the valley value of the voltage of the battery. Thus, the fluctuation of the voltage of the battery is effectively reduced when the battery is charged with pulsating waveforms, which is contributed to sample the peak value of the voltage of the battery, thereby ensuring a safety and reliability of the charging system.

According to an embodiment of the present disclosure, a frequency of the control signal is adjusted according to a voltage sampling value and/or a current sampling value. That is, the output of the PWM signal to the switch unit is controlled to maintain for a continuous time period, and then stop for a predetermined time period and then restart. In this way, the voltage applied to the battery is intermittent, thus realizing the intermittent charging of the battery, which can avoid safety risks caused by the heat generated when the battery is charged continuously and improves the reliability and safety of the charging to the battery. The control signal outputted to the switch unit is illustrated in FIG. 5A.

Further, the above charging method further includes: performing a communication with the device via the first charging interface to obtain status information of the device, and adjusting the duty ratio of the control signal according to the status information of the device, the voltage sampling value and/or current sampling value.

In other words, when the second charging interface is coupled to the first charging interface, the power adapter and the device may send communication query instructions to each other, and a communication connection can be established between the power adapter and the device after a corresponding reply instruction is received, such that the power adapter can obtain the status information of the device, negotiates with the device about the charging mode and the charging parameter (such as the charging current, the charging voltage) and controls the charging process.

According to an embodiment of the present disclosure, a voltage with a fourth pulsating waveform can be generated through a conversion of the transformer, and the voltage with the fourth pulsating waveform can be detected to generate a voltage detecting value, and the duty ratio of the control signal can be adjusted according to the voltage detecting value.

In detail, the transformer can be provided with an auxiliary winding. The auxiliary winding can generate the voltage with the fourth pulsating waveform according to the modulated voltage with the first pulsating waveform. The output voltage of the power adapter can be reflected by detecting the voltage with the fourth pulsating waveform, and the duty ratio of the control signal can be adjusted according to the voltage detecting value, such that the output of the power adapter meets the charging requirement of the battery.

In an embodiment of the present disclosure, obtaining the voltage sampling value by sampling a voltage on which the second rectification is performed includes followings. A peak value of the voltage on which the second rectification is performed is sampled and hold. A zero crossing point of the voltage on which the second rectification is performed is sampled. A peak voltage sampling and holding unit configured for sampling and holding the peak voltage at the zero crossing point is drained off. The peak voltage in the peak voltage sampling and holding unit is sampled so as to obtain the voltage sampling value. In this way, an accurate sampling can be performed on the voltage outputted by the power adapter, and it can be guaranteed that the voltage sampling value keeps synchronous with the voltage with the first pulsating waveform, i.e., the phase and variation trend of magnitude of the voltage sampling value are consistent with those of the voltage with the first pulsating waveform respectively.

Further, in an embodiment of the present disclosure, the above charging method device further includes: sampling the voltage with the first pulsating waveform, and controlling the switch unit to switch on for a predetermined time period to discharge the surge voltage in the voltage with the first pulsating waveform when a sampled voltage value is greater than a first predetermined voltage value.

The voltage with the first pulsating waveform is sampled so as to determine the sampled voltage value. When the sampled voltage value is greater than the first predetermined voltage value, it indicates that the power adapter is suffering the lightning interference and a surge voltage occurs, and thus it needs to drain off the surge voltage for ensuring the safety and reliability of charging. It is required to control the switch unit to switch on for a certain time period, to form a bleeder path, such that the surge voltage caused by the lightning can be drained off, thus avoiding interference of the lightning when the power adapter charges the device, and effectively improving the safety and reliability of the charging of the device. The first predetermined voltage value may be determined according to actual situations.

According an embodiment of the present disclosure, a communication with the device is performed via the first charging interface to determine the charging mode. When the charging mode is determined as the first charging mode, the charging current and/or charging voltage corresponding to the first charging mode can be obtained according to the status information of the device, so as to adjust the duty ratio of the control signal according to the charging current and/or charging voltage corresponding to the first charging mode. The charging mode includes the first charging mode and the second charging mode.

In other words, when the current charging mode is determined as the first charging mode, the charging current and/or charging voltage corresponding to the first charging mode can be obtained according to the status information of the device, such as the voltage, electric quantity, temperature of the battery, running parameters of the device and power consumption information of applications running on the device or the like. And the duty ratio of the control signal is adjusted according to the obtained charging current and/or charging voltage, such that the output of the power adapter meets the charging requirement, thus realizing the quick charging of the device.

The status information of the device may include the temperature of the battery. When the temperature of the battery is greater than a first predetermined temperature threshold, or the temperature of the battery is less than a second predetermined temperature threshold, if the current charging mode is the first charging mode, the first charging mode is switched to the second charging mode. The first predetermined temperature threshold is greater than the second predetermined temperature threshold. In other words, when the temperature of the battery is too low (for example, corresponding to less than the second predetermined temperature threshold) or too high (for example, corresponding to greater than the first predetermined temperature threshold), it is unsuitable to perform the quick charging, such that it needs to switch from the first charging mode to the second charging mode. In embodiments of the present disclosure, the first predetermined temperature threshold and the second predetermined temperature threshold can be set according to actual situations.

In an embodiment of the present disclosure, the switch unit is controlled to switch off when the temperature of the battery is greater than a predetermined high-temperature protection threshold. Namely, when the temperature of the battery exceeds the high-temperature protection threshold, it needs to apply a high-temperature protection strategy to control the switch unit to switch off, such that the power adapter stops charging the battery, thus realizing the high-temperature protection of the battery and improving the safety of charging. The high-temperature protection threshold may be different from or the same with the first temperature threshold. In an embodiment, the high-temperature protection threshold is greater than the first temperature threshold.

In another embodiment of the present disclosure, the device further obtains the temperature of the battery, and controls to stop charging the battery (for example by controlling a charging control switch to switch off at the device side) when the temperature of the battery is greater than the predetermined high-temperature protection threshold, so as to stop the charging process of the battery and to ensure the safety of charging.

Moreover, in an embodiment of the present disclosure, the charging method further includes: obtaining a temperature of the first charging interface, and controlling the switch unit to switch off when the temperature of the first charging interface is greater than a predetermined protection temperature. In other words, when the temperature of the charging interface exceeds a certain temperature, the control unit needs to apply the high-temperature protection strategy to control the switch unit to switch off, such that the power adapter stops charging the battery, thus realizing the high-temperature protection of the battery and improving the safety of charging.

Certainly, in another embodiment of the present disclosure, the device obtains the temperature of the first charging interface by performing the bidirectional communication with the power adapter via the second charging interface. When the temperature of the first charging interface is greater than the predetermined protection temperature, the device controls the charging control switch to switch off, i.e., the charging control switch can be switched off at the device side, so as to stop the charging process of the battery, thus ensuring the safety of charging.

During a process that the power adapter charges the device, the switch unit is controlled to switch off when the voltage sampling value is greater than a second predetermined voltage value. Namely, the magnitude of the voltage sampling value is determined during the process that the power adapter charges the device. When the voltage sampling value is greater than the second predetermined voltage value, it indicates that the voltage outputted by the power adapter is too high. At this time, the power adapter is controlled to stop charging the device by controlling the switch unit to switch off. In other words, the over-voltage protection of the power adapter can be realized by controlling the switch unit to switch off, thus ensuring the safety of charging.

Certainly, in an embodiment of the present disclosure, the device obtains the voltage sampling value by performing a bidirectional communication with the power adapter via the second charging interface, and controls to stop charging the battery when the voltage sampling value is greater than the second predetermined voltage value. Namely, the charging control switch is controlled to switch off at the device side, so as to stop the charging process, such that the safety of charging can be ensured.

In an embodiment of the present disclosure, during the process that the power adapter charges the device, the switch unit is controlled to switch off when the current sampling value is greater than a predetermined current value. In other words, during the process that the power adapter charges the device, the magnitude of the current sampling value is determined.

When the current sampling value is greater than the predetermined current value, it indicates that the current outputted by the power adapter is too high. At this time, the power adapter is controlled to stop charging the device by controlling the switch unit to switch off. In other words, the over-current protection of the power adapter is realized by controlling the switch unit to switch off, thus ensuring the safety of charging.

Similarly, the device obtains the current sampling value by performing the bidirectional communication with the power adapter via the second charging interface, and controls to stop charging the battery when the current sampling value is greater than the predetermined current value. In other words, the charging control switch is controlled to be switched off at the device side, such that the charging process of the battery is stopped, thus ensuring the safety of charging.

The second predetermined voltage value and the predetermined current value may be set according to actual situations.

In embodiments of the present disclosure, the status information of the device includes the electric quantity of the battery, the temperature of the battery, the voltage/current of the battery of the device, interface information of the device and information on path impedance of the device.

In detail, the power adapter can be coupled to the device via a universal serial bus (USB) interface. The USB interface may be a general USB interface, or a micro USB interface. A data wire in the USB interface is configured as the data wire in the first charging interface, and configured for the bidirectional communication between the power adapter and the device. The data wire may be D+ and/or D− wire in the USB interface. The bidirectional communication may refer to an information interaction performed between the power adapter and the device.

The power adapter performs the bidirectional communication with the device via the data wire in the USB interface, so as to determine to charge the device in the first charging mode.

As an embodiment, when the power adapter performs the bidirectional communication with the device via the first charging interface so as to determine to charge the device in the first charging mode, the power adapter sends a first instruction to the device. The first instruction is configured to query the device whether to enable the first charging mode. The power adapter receives a reply instruction to the first instruction from the device. The reply instruction to the first instruction is configured to indicate that the device agrees to enable the first charging mode.

As an embodiment, before the power adapter sends the first instruction to the device, the power adapter charges the device in the second charging mode. When the power adapter determines that a charging duration of the second charging mode is greater than a predetermined threshold, the power adapter sends the first instruction to the device.

It should be understood that, when the power adapter determines that the charging duration of the second charging mode is greater than the predetermined threshold, the power adapter may determine that the device has identified it as a power adapter, such that the quick charging query communication may be enabled.

As an embodiment, the power adapter is controlled to adjust a charging current to a charging current corresponding to the first charging mode by controlling the switch unit. Before the power adapter charges the device with the charging current corresponding to the first charging mode, a bidirectional communication is performed with the device via the first charging interface to determine a charging voltage corresponding to the first charging mode, and the power adapter is controlled to adjust a charging voltage to the charging voltage corresponding to the first charging mode.

As an embodiment, performing the bidirectional communication with the device via the first charging interface to determine the charging voltage corresponding to the first charging mode includes: sending by the power adapter a second instruction to the device, receiving by the power adapter a reply instruction to the second instruction sent from the device, and determining by the power adapter the charging voltage corresponding to the first charging mode according to the reply instruction to the second instruction. The second instruction is configured to query whether a current output voltage of the power adapter is suitable for being used as the charging voltage corresponding to the first charging mode. The reply instruction to the second instruction is configured to indicate that the current output voltage of the power adapter is suitable, high or low.

As an embodiment, before controlling the power adapter to adjust the charging current to the charging current corresponding to the first charging mode, the charging current corresponding to the first charging mode is determined by performing the bidirectional communication with the device via the first charging interface.

As an embodiment, determining the charging current corresponding to the first charging mode by performing the bidirectional communication with the device via the first charging interface includes: sending by the power adapter a third instruction to the device, receiving by the power adapter a reply instruction to the third instruction sent from the device and determining by the power adapter the charging current corresponding to the first charging mode according to the reply instruction to the third instruction. The third instruction is configured to query a maximum charging current currently supported by the device. The reply instruction to the third instruction is configured to indicate the maximum charging current currently supported by the device.

The power adapter may determine the above maximum charging current as the charging current corresponding to the first charging mode, or may set the charging current as a charging current less than the maximum charging current.

As an embodiment, during the process that the power adapter charges the device in the first charging mode, the bidirectional communication is performed with the device via the first charging interface, so as to continuously adjust a charging current outputted to the battery from the power adapter by controlling the switch unit.

The power adapter may query the status information of the device continuously, so as to adjust the charging current continuously, for example, query the voltage of the battery of the device, the electric quantity of the battery, etc.

As an embodiment, performing the bidirectional communication with the device via the first charging interface to continuously adjust the charging current outputted to the battery from the power adapter by controlling the switch unit includes: sending by the power adapter a fourth instruction to the device, receiving by the power adapter a reply instruction to the fourth instruction sent by the device, and adjusting the charging current by controlling the switch unit according to the current voltage of the battery. The fourth instruction is configured to query a current voltage of the battery in the device. The reply instruction to the fourth instruction is configured to indicate the current voltage of the battery in the device.

As an embodiment, adjusting the charging current by controlling the switch unit according to the current voltage of the battery includes: adjusting the charging current outputted to the battery from the power adapter to a charging current value corresponding to the current voltage of the battery by controlling the switch unit according to the current voltage of the battery and a predetermined correspondence between battery voltage values and charging current values.

In detail, the power adapter may store the correspondence between battery voltage values and charging current values in advance.

As an embodiment, during the process that the power adapter charges the device in the first charging mode, it is determined whether the first charging interface and the second charging interface are in poor contact by performing the bidirectional communication with the device via the first charging interface. When it is determined that the first charging interface and the second charging interface are in poor contact, the power adapter is controlled to quit the first charging mode.

As an embodiment, before determining whether the first charging interface and the second charging interface are in poor contact, the power adapter receives information indicating path impedance of the device from the device. The power adapter sends a fourth instruction to the device. The fourth instruction is configured to query a current voltage of the battery in the device. The power adapter receives a reply instruction to the fourth instruction sent by the device. The reply instruction to the fourth instruction is configured to indicate the current voltage of the battery in the device. The power adapter determines path impedance from the power adapter to the battery according to an output voltage of the power adapter and the current voltage of the battery and determines whether the first charging interface and the second charging interface are in poor contact according to the path impedance from the power adapter to the battery, the path impedance of the device, and path impedance of a charging wire between the power adapter and the device.

As an embodiment, before the power adapter is controlled to quit the first charging mode, a fifth instruction is sent to the device. The fifth instruction is configured to indicate that the first charging interface and the second charging interface are in poor contact.

After sending the fifth instruction, the power adapter may quit the first charging mode or reset.

The quick charging process according to embodiments of the present disclosure has been described from the perspective of the power adapter; hereinafter, the quick charging process according to embodiments of the present disclosure will be described from the perspective of the device in the following.

In embodiments of the present disclosure, the device supports the second charging mode and the first charging mode. The charging current of the first charging mode is greater than that of the second charging mode. The device performs the bidirectional communication with the power adapter via the second charging interface such that the power adapter determines to charge the device in the first charging mode. The power adapter outputs according to a charging current corresponding to the first charging mode, for charging the battery in the device.

As an embodiment, performing by the device the bidirectional communication with the power adapter via the second charging interface such that the power adapter determines to charge the device in the first charging mode includes: receiving by the device the first instruction sent by the power adapter, in which the first instruction is configured to query the device whether to enable the first charging mode; sending by the device a reply instruction to the first instruction to the power adapter. The reply instruction to the first instruction is configured to indicate that the device agrees to enable the first charging mode.

As an embodiment, before the device receives the first instruction sent by the power adapter, the battery in the device is charged by the power adapter in the second charging mode. When the power adapter determines that a charging duration of the second charging mode is greater than a predetermined threshold, the device receives the first instruction sent by the power adapter.

As an embodiment, before the power adapter outputs according to the charging current corresponding to the first charging mode for charging the battery in the device, the device performs the bidirectional communication with the power adapter via the second charging interface, such that the power adapter determines the charging voltage corresponding to the first charging mode.

As an embodiment, performing by the device the bidirectional communication with the power adapter via the second charging interface such that the power adapter determines the charging voltage corresponding to the first charging mode includes: receiving by the device a second instruction sent by the power adapter, and sending by the device a reply instruction to the second instruction to the power adapter. The second instruction is configured to query whether a current output voltage of the power adapter is suitable for being used as the charging voltage corresponding to the first charging mode. The reply instruction to the second instruction is configured to indicate that the current output voltage of the power adapter is suitable, high or low.

As an embodiment, before the device receives the charging current corresponding to the first charging mode from the power adapter for charging the battery in the device, the device performs the bidirectional communication with the power adapter via the second charging interface, such that the power adapter determines the charging current corresponding to the first charging mode.

Performing by the device the bidirectional communication with the power adapter via the second charging interface such that the power adapter determines the charging current corresponding to the first charging mode includes: receiving by the device a third instruction sent by the power adapter, in which the third instruction is configured to query a maximum charging current currently supported by the device; sending by the device a reply instruction to the third instruction to the power adapter, in which the reply instruction to the third instruction is configured to indicate the maximum charging current currently supported by the device, such that the power adapter determines the charging current corresponding to the first charging mode according to the maximum charging current.

As an embodiment, during a process that the power adapter charges the device in the first charging mode, the device performs the bidirectional communication with the power adapter via the second charging interface, such that the power adapter continuously adjusts a charging current outputted to the battery.

Performing by the device the bidirectional communication with the power adapter via the second charging interface such that the power adapter continuously adjusts a charging current outputted to the battery includes: receiving by the device a fourth instruction sent by the power adapter, in which the fourth instruction is configured to query a current voltage of the battery in the device; sending by the device a reply instruction to the fourth instruction to the power adapter, in which the reply instruction to the fourth instruction is configured to indicate the current voltage of the battery in the device, such that the power adapter continuously adjusts the charging current outputted to the battery according to the current voltage of the battery.

As an embodiment, during the process that the power adapter charges the device in the first charging mode, the device performs the bidirectional communication with the control unit, such that the power adapter determines whether the first charging interface and the second charging interface are in poor contact.

Performing by the device the bidirectional communication with the power adapter, such that the power adapter determines whether the first charging interface and the second charging interface are in poor contact includes: receiving by the device a fourth instruction sent by the power adapter, in which the fourth instruction is configured to query a current voltage of the battery in the device; sending by the device a reply instruction to the fourth instruction to the power adapter, in which the reply instruction to the fourth instruction is configured to indicate the current voltage of the battery in the device, such that the power adapter determines whether the first charging interface and the second charging interface are in poor contact according to an output voltage of the power adapter and the current voltage of the battery.

As an embodiment, the device receives a fifth instruction sent by the power adapter. The fifth instruction is configured to indicate that the first charging interface and the second charging interface are in poor contact.

In order to initiate and adopt the first charging mode, the power adapter may perform a quick charging communication procedure with the device, for example, by one or more handshakes, so as to realize the quick charging of battery. Referring to FIG. 6, the quick charging communication procedure according to embodiments of the present disclosure and respective stages in the quick charging process will be described in detail. It should be understood that, communication actions or operations illustrated in FIG. 6 are merely exemplary. Other operations or various modifications of respective operations in FIG. 6 can be implemented in embodiments of the present disclosure. In addition, respective stages in FIG. 6 may be executed in an order different from that illustrated in FIG. 6, and it is unnecessary to execute all the operations illustrated in FIG. 6. It should be noted that, a curve in FIG. 6 represents a variation trend of a peak value or a mean value of the charging current, rather than a curve of actual charging current.

In conclusion, with the charging method according to embodiments of the present disclosure, the power adapter is controlled to output the voltage with the third pulsating waveform which meets the charging requirement, and the voltage with the third pulsating waveform outputted by the power adapter is directly applied to the battery of the device, thus realizing quick charging to the battery directly by the pulsating output voltage/current. In contrast to the conventional constant voltage and constant current, a magnitude of the pulsating output voltage/current changes periodically, such that a lithium precipitation of the lithium battery may be reduced, the service life of the battery may be improved, and a probability and intensity of arc discharge of a contact of a charging interface may be reduced, the service life of the charging interfaces may be prolonged, and it is beneficial to reduce polarization effect of the battery, improve a charging speed, and reduce heat of the battery, thus ensuring the reliability and safety of the device during the charging. Moreover, since the power adapter outputs the voltage with the pulsating waveform, it is unnecessary to provide an electrolytic capacitor in the power adapter, which can not only realize simplification and miniaturization of the power adapter, but can also decrease cost greatly. Furthermore, during the process of performing the pulsating charging on the battery of the device through the power adaptor, the length of the valley of the outputted voltage with the third pulsating waveform is decreased by controlling the duty ratio of the control signal through the control unit, such that a voltage difference between a voltage peak and a voltage valley is reduced, thereby decreasing a fluctuation value of the voltage of the battery when the battery is charged via the pulsating charging. Therefore, it is contributed to sample the peak value of the voltage of the battery through the battery voltage sampling unit. The power adaptor may adjust the charging state in real time according to the peak value of voltage of the battery, thereby ensuring the safety and reliability of the charging system.

In at least one embodiment of the present disclosure, part or all structure (hardware and software) of the adapter can be integrated into the device. Integrated structure of the adapter and the device can be called as the charging system of the present disclosure, or called as a device.

In the specification of the present disclosure, it is to be understood that terms such as "central," "longitudinal," "lateral," "length," "width," "thickness," "upper," "lower," "front," "rear," "left," "right," "vertical," "horizontal," "top," "bottom," "inner," "outer," "clockwise," "counterclockwise," "axial," "radial," and "circumference" refer to the orientations and location relations which are the orientations and location relations illustrated in the drawings, and for describing the present disclosure and for describing in simple, and which are not intended to indicate or imply that the device or the elements are disposed to locate at the specific directions or are structured and performed in the specific directions, which could not to be understood to the limitation of the present disclosure.

In addition, terms such as "first" and "second" are used herein for purposes of description and are not intended to indicate or imply relative importance or significance or to imply the number of indicated technical features. Thus, the feature defined with "first" and "second" may comprise one or more of this feature. In the description of the present disclosure, "a plurality of" means two or more than two, unless specified otherwise.

In the present disclosure, unless specified or limited otherwise, the terms "mounted," "connected," "coupled," "fixed" and the like are used broadly, and may be, for example, fixed connections, detachable connections, or integral connections; may also be mechanical or electrical connections; may also be direct connections or indirect connections via intervening structures; may also be inner communications of two elements, which can be understood by those skilled in the art according to specific situations.

In the present disclosure, unless specified or limited otherwise, a structure in which a first feature is "on" or "below" a second feature may include an embodiment in which the first feature is in direct contact with the second feature, and may also include an embodiment in which the first feature and the second feature are not in direct contact with each other, but are contacted via an additional feature formed therebetween. Furthermore, a first feature "on," "above," or "on top of" a second feature may include an embodiment in which the first feature is right or obliquely "on," "above," or "on top of" the second feature, or just means that the first feature is at a height higher than that of the second feature; while a first feature "below," "under," or "on bottom of" a second feature may include an embodiment in which the first feature is right or obliquely "below," "under," or "on bottom of" the second feature, or just means that the first feature is at a height lower than that of the second feature.

Reference throughout this specification to "an embodiment," "some embodiments," "one embodiment", "another example," "an example," "a specific example," or "some examples," means that a particular feature, structure, material, or characteristic described in connection with the embodiment or example is included in at least one embodiment or example of the present disclosure. Thus, the appearances of the phrases such as "in some embodiments," "in one embodiment", "in an embodiment", "in another example," "in an example," "in a specific example," or "in some examples," in various places throughout this specification are not necessarily referring to the same embodiment or example of the present disclosure. Furthermore, the particular features, structures, materials, or characteristics may be combined in any suitable manner in one or more embodiments or examples.

Those skilled in the art may be aware that, in combination with the examples described in the embodiments disclosed in this specification, units and algorithm steps can be implemented by electronic hardware, or a combination of computer software and electronic hardware. In order to clearly illustrate interchangeability of the hardware and software, components and steps of each example are already described in the description according to the function commonalities. Whether the functions are executed by hardware or software depends on particular applications and design constraint conditions of the technical solutions. Persons skilled in the art may use different methods to implement the described functions for each particular application, but it should not be considered that the implementation goes beyond the scope of the present disclosure.

Those skilled in the art may be aware that, with respect to the working process of the system, the device and the unit, reference is made to the part of description of the method embodiment for simple and convenience, which are described herein.

In embodiments of the present disclosure, it should be understood that, the disclosed system, device and method may be implemented in other way. For example, embodiments of the described device are merely exemplary. The partition of units is merely a logical function partitioning. There may be other partitioning ways in practice. For example, several units or components may be integrated into another system, or some features may be ignored or not implemented. Further, the coupling between each other or directly coupling or communication connection may be implemented via some interfaces. The indirect coupling or communication connection may be implemented in an electrical, mechanical or other manner.

In embodiments of the present disclosure, it should be understood that, the units illustrated as separate components can be or not be separated physically, and components described as units can be or not be physical units, i.e., can be located at one place, or can be distributed onto multiple network units. It is possible to select some or all of the units according to actual needs, for realizing the objective of embodiments of the present disclosure.

In addition, each functional unit in the present disclosure may be integrated in one progressing module, or each functional unit exists as an independent unit, or two or more functional units may be integrated in one module.

If the integrated module is embodied in software and sold or used as an independent product, it can be stored in the computer readable storage medium. Based on this, the technical solution of the present disclosure or a part making a contribution to the related art or a part of the technical solution may be embodied in a manner of software product. The computer software produce is stored in a storage medium, including some instructions for causing one computer device (such as a personal PC, a server, or a network device etc.) to execute all or some of steps of the method according to embodiments of the present disclosure. The above-mentioned storage medium may be a medium able to store program codes, such as, USB flash disk, mobile hard disk drive (mobile HDD), read-only memory (ROM), random-access memory (RAM), a magnetic tape, a floppy disc, an optical data storage device, and the like.

Although explanatory embodiments have been illustrated and described, it would be appreciated by those skilled in the art that the above embodiments cannot be construed to limit the present disclosure, and changes, alternatives, and modifications can be made in the embodiments without departing from spirit, principles and scope of the present disclosure.

What is claimed is:

1. A power adapter, comprising:
a first rectification unit, without an electrolytic capacitor provided after the first rectification unit, configured to rectify an input alternating current and output a voltage with a first pulsating waveform;
a switch unit, configured to modulate the voltage with the first pulsating waveform according to a control signal;
a transformer, configured to output a voltage with a second pulsating waveform according to the modulated voltage with the first pulsating waveform;
a second rectification unit, configured to rectify the voltage with the second pulsating waveform to output a voltage with a third pulsating waveform, wherein the voltage with the third pulsating waveform is configured to be applied to a battery in a device for charging the battery of the device;
a first charging interface, coupled to the second rectification unit, configured to apply the voltage with the third pulsating waveform to the battery via a second charging interface of the device when the first charging interface is coupled to the second charging interface, in which the second charging interface is coupled to the battery, and the first charging interface comprises: a power wire, configured to charge the battery, and a data wire, configured to communicate with the device;
a control unit, coupled to the switch unit, and configured to output the control signal to the switch unit and to adjust a duty ratio of the control signal such that the voltage with the third pulsating waveform meets a charging requirement of the device, and during a process that the power adaptor charges the battery by outputting the voltage with the third pulsating waveform to the battery, the control unit is further configured to adjust the duty ratio of the control signal to decrease a time length of a valley of the voltage with the third pulsating waveform under a case that a peak value of a voltage of the battery is sampled,
wherein, the power adapter is configured to charge the device in a second charging mode, and the control unit is configured to send a first instruction to the device when determining that a charging duration of the second charging mode is greater than a predetermined threshold, in which, a charging speed of the first charging mode being faster than that of the second charging mode, the first instruction is configured to query the device whether to enable the first charging mode, and when determining that the charging duration of the second charging mode is greater than the predetermined threshold, the power adapter determines that the device has identified the power adapter, such that the first charging mode is enabled; and
the control unit is configured to receive a reply instruction to the first instruction from the device, in which the reply instruction to the first instruction is configured to indicate that the device agrees to enable the first charging mode.

2. The power adapter according to claim 1, wherein the control unit is further configured to control the power adapter to adjust a charging current to a charging current corresponding to the first charging mode by controlling the switch unit, and before the power adapter charges the device with the charging current corresponding to the first charging mode,
the control unit is configured to perform the bidirectional communication with the device via the data wire of the first charging interface to determine a charging voltage corresponding to the first charging mode, and to control the power adapter to adjust a charging voltage to the charging voltage corresponding to the first charging mode.

3. The power adapter according to claim 2, wherein when performing the bidirectional communication with the device via the data wire of the first charging interface to determine the charging voltage corresponding to the first charging mode,
the control unit is configured to send a second instruction to the device, in which the second instruction is configured to query whether a current output voltage of the power adapter is suitable for being used as the charging voltage corresponding to the first charging mode;
the control unit is configured to receive a reply instruction to the second instruction sent from the device, in which the reply instruction to the second instruction is configured to indicate that the current output voltage of the power adapter is suitable, high or low; and
the control unit is configured to determine the charging voltage corresponding to the first charging mode according to the reply instruction to the second instruction.

4. The power adapter according to claim 3, wherein, before controlling the power adapter to adjust the charging current to the charging current corresponding to the first charging mode, the control unit is further configured to perform the bidirectional communication with the device via the data wire of the first charging interface to determine the charging current corresponding to the first charging mode.

5. The power adapter according to claim 4, wherein, when performing the bidirectional communication with the device via the data wire of the first charging interface to determines the charging current corresponding to the first charging mode,
the control unit is configured to send a third instruction to the device, in which the third instruction is configured to query a maximum charging current currently supported by the device;
the control unit is configured to receive a reply instruction to the third instruction sent from the device, in which the reply instruction to the third instruction is configured to indicate the maximum charging current currently supported by the device; and
the control unit is configured to determine the charging current corresponding to the first charging mode according to the reply instruction to the third instruction.

6. The power adapter according to claim 5, wherein during a process that the power adapter charges the device in the first charging mode, the control unit is further configured to perform the bidirectional communication with the device via the data wire of the first charging interface, so as to continuously adjust a charging current outputted to the battery from the power adapter by controlling the switch unit.

7. The power adapter according to claim 6, wherein, when performing the bidirectional communication with the device via the data wire of the first charging interface to continuously adjust the charging current outputted to the battery from the power adapter by controlling the switch unit,
the control unit is configured to send a fourth instruction to the device, in which the fourth instruction is configured to query a current voltage of the battery in the device;
the control unit is configured to receive a reply instruction to the fourth instruction sent by the device, in which the reply instruction to the fourth instruction is configured to indicate the current voltage of the battery in the device; and
the control unit is configured to adjust the charging current by controlling the switch unit according to the current voltage of the battery.

8. The power adapter according to claim 7, wherein the control unit is configured to adjust the charging current outputted to the battery from the power adapter to a charging current value corresponding to the current voltage of the battery by controlling the switch unit according to the current voltage of the battery and a predetermined correspondence between battery voltage values and charging current values.

9. The power adapter according to claim 6, wherein, during the process that the power adapter charges the device in the first charging mode, the control unit is further configured to determine whether the first charging interface and the second charging interface are in poor contact by performing the bidirectional communication with the device via the data wire of the first charging interface,
wherein, when determining that the first charging interface and the second charging interface are in poor contact, the control unit is configured to control the power adapter to quit the first charging mode.

10. The power adapter according to claim 9, wherein, before determining whether the first charging interface and the second charging interface are in poor contact, the control unit is further configured to receive information indicating path impedance of the device from the device, wherein
the control unit is configured to send a fourth instruction to the device, in which the fourth instruction is configured to query a current voltage of the battery in the device;
the control unit is configured to receive a reply instruction to the fourth instruction sent by the device, in which the reply instruction to the fourth instruction is configured to indicate the current voltage of the battery in the device;
the control unit is configured to determine path impedance from the power adapter to the battery according to an output voltage of the power adapter and the current voltage of the battery; and
the control unit is configured to determine whether the first charging interface and the second charging interface are in poor contact according to the path impedance from the power adapter to the battery, the path impedance of the device, and path impedance of a charging circuit between the power adapter and the device.

11. The power adapter according to claim 10, wherein, before the power adapter quits the first charging mode, the control unit is further configured to send a fifth instruction to the device, in which the fifth instruction is configured to indicate that the first charging interface and the second charging interface are in poor contact.

12. A charging method, comprising:
performing a first rectification on an input alternating current to output a voltage with a first pulsating waveform without passing an electrolytic capacitor;
modulating the voltage with the first pulsating waveform;
outputting a voltage with a second pulsating waveform according to the modulated voltage with the first pulsating waveform;
performing a second rectification on the voltage with the second pulsating waveform to output a voltage with a third pulsating waveform;
applying the voltage with the third pulsating waveform to a battery via a first charging interface;
adjusting a duty ratio of a control signal for modulating the voltage with the first pulsating waveform such that the voltage with the third pulsating waveform meets a charging requirement;
during a process that the power adaptor charges the battery by outputting the voltage with the third pulsating waveform to the battery, decreasing a time length of a valley of the voltage with the third pulsating waveform by adjusting the duty ratio of the control signal for modulating the voltage with the first pulsating waveform under a case that a peak value of a voltage of the battery is sampled,
charging the device in a second charging mode;
sending a first instruction to the device when determining that a charging duration of the second charging mode is greater than a predetermined threshold, in which, a charging speed of the first charging mode being faster than that of the second charging mode, the first instruction is configured to query the device whether to enable the first charging mode, and when determining that the charging duration of the second charging mode is greater than the predetermined threshold, the power adapter determines that the device has identified the power adapter, such that the first charging mode is enabled; and receiving a reply instruction to the first instruction from the device, in which the reply instruction to the first instruction is configured to indicate that the device agrees to enable the first charging mode.

13. The charging method according to claim 12, further comprising:

when determining the charging mode as the first charging mode, obtaining a charging current and/or a charging voltage corresponding to the first charging mode according to status information of the device, so as to adjust the duty ratio of the control signal according to the charging current and/or the charging voltage corresponding to the first charging mode.

14. The charging method according to claim 12, wherein the device performs a bidirectional communication with the power adapter via the second charging interface, such that power adapter determines to charge the device in the first charging mode, in which the power adapter outputs according to the charging current corresponding to the first charging mode, for charging the battery in the device.

15. The charging method according to claim 12, wherein
modulating the voltage with the first pulsating waveform comprises:
modulating the voltage with the first pulsating waveform by controlling a switch unit,
outputting a voltage with a second pulsating waveform according to the modulated voltage with the first pulsating waveform comprises:
applying the modulated voltage with the first pulsating waveform to a primary side of a transformer; and
outputting the voltage with the second pulsating waveform at a secondary of the transformer.

* * * * *